United States Patent
Cometti

(10) Patent No.: US 8,737,136 B2
(45) Date of Patent: May 27, 2014

(54) APPARATUS AND METHOD FOR DETERMINING A READ LEVEL OF A MEMORY CELL BASED ON CYCLE INFORMATION

(75) Inventor: Aldo G. Cometti, San Diego, CA (US)

(73) Assignee: STEC, Inc., Santa Ana, CA (US)

(*) Notice: Subject to any disclaimer, the term of this patent is extended or adjusted under 35 U.S.C. 154(b) by 314 days.

(21) Appl. No.: 13/076,340

(22) Filed: Mar. 30, 2011

(65) Prior Publication Data

US 2012/0236656 A1 Sep. 20, 2012

Related U.S. Application Data

(60) Provisional application No. 61/363,157, filed on Jul. 9, 2010.

(51) Int. Cl.
*G11C 16/06* (2006.01)
*G11C 16/04* (2006.01)

(52) U.S. Cl.
USPC .................................. 365/185.22; 365/185.18

(58) Field of Classification Search
USPC ........................................ 365/185.22, 185.18
See application file for complete search history.

(56) References Cited

U.S. PATENT DOCUMENTS

| | | | |
|---|---|---|---|
| 5,729,489 A | 3/1998 | Fazio et al. | |
| 6,396,742 B1 | 5/2002 | Korsh et al. | |
| 6,429,785 B1 | 8/2002 | Griffin et al. | |
| 6,519,184 B2 | 2/2003 | Tanaka et al. | |
| 6,643,177 B1 | 11/2003 | Le et al. | |
| 6,675,071 B1 | 1/2004 | Griffin, Jr. et al. | |
| 6,888,758 B1 | 5/2005 | Hemink et al. | |
| 6,928,001 B2 | 8/2005 | Avni et al. | |
| 6,937,521 B2 | 8/2005 | Avni et al. | |
| 7,009,889 B2 | 3/2006 | Tran et al. | |
| 7,054,199 B2 | 5/2006 | Lee et al. | |
| 7,173,852 B2 | 2/2007 | Gorobets et al. | |
| 7,599,208 B2 | 10/2009 | Kang | |
| 7,613,045 B2 | 11/2009 | Murin et al. | |
| 7,656,707 B2* | 2/2010 | Kozlov | 365/185.05 |
| 7,812,389 B2 | 10/2010 | Tanaka et al. | |
| 8,072,805 B2* | 12/2011 | Chou et al. | 365/185.03 |
| 8,086,225 B2 | 12/2011 | Lee | |

(Continued)

OTHER PUBLICATIONS

Zhou, et al., "Error-correcting schemes with dynamic thresholds in nonvolatile memories," Information Theory Proceedings (ISIT), 2011 IEEE International Symposium, Jul. 31-Aug. 5, 2011, pp. 2143-2147.

(Continued)

*Primary Examiner* — Hoai V Ho
*Assistant Examiner* — Tri Hoang
(74) *Attorney, Agent, or Firm* — McDermott Will & Emery LLP

(57) ABSTRACT

Disclosed is an apparatus and method for determining a read level voltage to apply to a block of memory cells in a non-volatile memory circuit. A prediction value is compared to a prediction indicator to determine whether a new read level voltage to be applied to read the memory cells should be estimated. If a new read level should be estimated the new read level is calculated as a function of an initial read level and a dwell time and a number of program/erase cycles. A controller provides one or more programming commands representative of the new read level voltage to the memory circuit to read the cells.

35 Claims, 11 Drawing Sheets

(56) References Cited

U.S. PATENT DOCUMENTS

| | | |
|---|---|---|
| 8,315,092 B2 | 11/2012 | Strasser et al. |
| 2002/0174394 A1 | 11/2002 | Ledford et al. |
| 2005/0125199 A1 | 6/2005 | Slaight |
| 2005/0144358 A1 | 6/2005 | Conley et al. |
| 2005/0248999 A1 | 11/2005 | Tamura et al. |
| 2006/0039196 A1 | 2/2006 | Gorobets et al. |
| 2006/0061795 A1 | 3/2006 | Walmsley |
| 2006/0244041 A1 | 11/2006 | Tanaka et al. |
| 2008/0229164 A1 | 9/2008 | Tamura et al. |
| 2009/0104900 A1 | 4/2009 | Lee |
| 2009/0109756 A1 | 4/2009 | Aritome |
| 2009/0187785 A1 | 7/2009 | Gonzalez et al. |
| 2009/0259916 A1* | 10/2009 | Hsu et al. .................. 714/758 |
| 2009/0282189 A1 | 11/2009 | Best et al. |
| 2010/0008137 A1 | 1/2010 | Jang et al. |
| 2010/0110748 A1 | 5/2010 | Best |
| 2010/0118608 A1* | 5/2010 | Song et al. ............... 365/185.11 |
| 2010/0180073 A1* | 7/2010 | Weingarten et al. .......... 711/103 |
| 2010/0315873 A1 | 12/2010 | Lee |
| 2011/0055468 A1 | 3/2011 | Gonzalez et al. |
| 2011/0167305 A1* | 7/2011 | Haratsch et al. ................ 714/42 |
| 2011/0188291 A1 | 8/2011 | Chevallier et al. |
| 2011/0219203 A1* | 9/2011 | Nurminen et al. ............ 711/165 |
| 2012/0017138 A1 | 1/2012 | Erez et al. |
| 2012/0147660 A1 | 6/2012 | Chevallier et al. |
| 2012/0236641 A1 | 9/2012 | Hu |
| 2012/0239991 A1 | 9/2012 | Melik-Martirosian |
| 2012/0319585 A1 | 12/2012 | Shteynberg et al. |
| 2013/0007344 A1 | 1/2013 | Belgal et al. |
| 2013/0097362 A1 | 4/2013 | Tan et al. |

OTHER PUBLICATIONS

Cai, et al., "Flash Correct-and-Refresh: Retention-Aware Error Management for Increased Flash Memory Lifetime," Computer Design (ICCD), 2012 IEEE 30$^{th}$ International Conference, Sep. 20-Oct. 3, 2012, pp. 94-101.

Chen, et al., "Reliability analysis and improvement for multi-level non-volatile memories with soft information," Design Automation Conference (DAC), 2011, 48$^{th}$ ACM/EDAC/IEEE, Jun. 2011, pp. 753-758.

* cited by examiner

APPARATUS AND METHOD FOR DETERMINING A READ LEVEL OF A MEMORY CELL BASED ON CYCLE INFORMATION

CROSS-REFERENCES TO RELATED APPLICATIONS

This application claims priority from U.S. Provisional Application No. 61/363,157, filed Jul. 9, 2010, which is incorporated herein by reference in its entirety.

TECHNICAL FIELD

The subject technology relates generally to memory devices and in particular multi-level cell flash memory devices.

BACKGROUND

Flash memory bears little resemblance to a magnetic recording system. Commodity flash chips are closed systems with no external access to analog signals, in sharp contrast to the typical Hard Disk Drive (HDD) where analog signals have always been available for study. Even though the HDD is a complex electro-mechanical system and can suffer catastrophic failure, it has been possible to engineer drives to have a life expectancy with little to no degradation in performance, which extend beyond their time of technical obsolescence. The performance of flash memory, on the other hand, is known to degrade through the life cycle and has a finite life. Consequently, since flash memory was first conceived as a memory device the target error rate at the output of the chip has been very low, as opposed to systems where stronger Error Correction Coding (ECC) may be used.

Lower priced Solid State Drives (SSD) are typically manufactured using multi-level cell (MLC) flash memory for increased data capacity, but MLC is less reliable than single-level cell (SLC) flash memory. Consumer SSD manufacturers have mitigated such problems by employing interleaving and/or providing excess capacity in conjunction with wear-leveling algorithms. MLC flash endurance, however, has not been proven acceptable for enterprise SSD applications. Even with the increased data capacity of MLC, it becomes more expensive in enterprise applications because of its disproportionately large decrease in program/erase (P/E) cycles over time due to increased (wear causing) stresses required to read, program and erase the flash, causing a gradual degradation in endurance.

SUMMARY

A method for determining a read level voltage to apply to a memory cell in a flash memory circuit is disclosed. In one aspect, the method includes comparing a prediction value to a prediction indicator to determine whether a previous RL voltage should be used or a new RL voltage should be estimated, calculating the RL voltage as a function of the a first RL voltage and an estimation parameter when the RL voltage should be estimated, and providing to the memory circuit a programming command representative of the RL voltage to read the memory cell.

In another aspect, the method determines the RL voltage should be estimated when the read operation is a first read after a write operation or a read address is equal to a marginal address or a read level margin (RLM) value reaches a RLM threshold value, the RLM value being calculated when the read operation is the first read after the write operation and the read address is equal to the marginal address, the RLM value being calculated as a function of an error level value and a number of program/erase (P/E) cycles.

In yet another aspect, the method includes generating at run-time a prediction value, reading a prediction indicator from a lookup table, comparing the prediction value to the prediction indicator to determine whether a RL voltage should be estimated, and, when the RL voltage should be estimated, calculating a temperature factor as a function of a die temperature associated with the memory circuit, calculating a process corner factor as a function of a nominal process corner associated with the memory circuit and a number of P/E cycles, calculating a location correction factor as a function of a block location associated with the memory circuit and a page location associated with the memory circuit, calculating a correction element, calculating an estimation parameter as a function of a memory dwell time, the number of P/E cycles, the temperature factor, the process corner factor, the location correction factor, and the correction element, calculating the RL voltage as a function of the a first RL voltage and the estimation parameter, and providing to the memory circuit a programming command representative of the RL voltage to read the memory cell.

Also disclosed is a control circuit for determining a read level (RL) voltage to apply to a memory cell in a non-volatile memory circuit. In one aspect, the control circuit includes a memory interface configured to be operably coupled to the memory circuit and a controller, wherein the controller is configured to, on receiving a signal from a host interface representative of a memory read operation associated with the memory circuit, compare a prediction value to a prediction indicator to determine whether the RL voltage should be estimated, calculate the RL voltage as a function of the a first RL voltage and an estimation parameter when the RL voltage should be estimated, and provide to the memory circuit a programming command representative of the RL voltage to read the memory cell.

Also disclosed is a system for determining a read level (RL) voltage to apply to a memory cell in a non-volatile memory circuit. In one aspect, the system includes a host interface operably coupled to a host device, to receive data from the host device, and to send data to the host device, a storage medium interface operably coupled to a volatile memory, a memory interface operably coupled to the memory circuit, and a controller, wherein the controller is operable to, on receiving a signal from a host interface representative of a memory read operation associated with the memory circuit, compare a prediction value to a prediction indicator to determine whether the RL voltage should be estimated, calculate the RL voltage as a function of the a first RL voltage and an estimation parameter when the RL voltage should be estimated, and provide to the memory circuit a programming command representative of the RL voltage to read the memory cell.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

A detailed description will be made with reference to the accompanying drawings.

DETAILED DESCRIPTION

Figure 1:
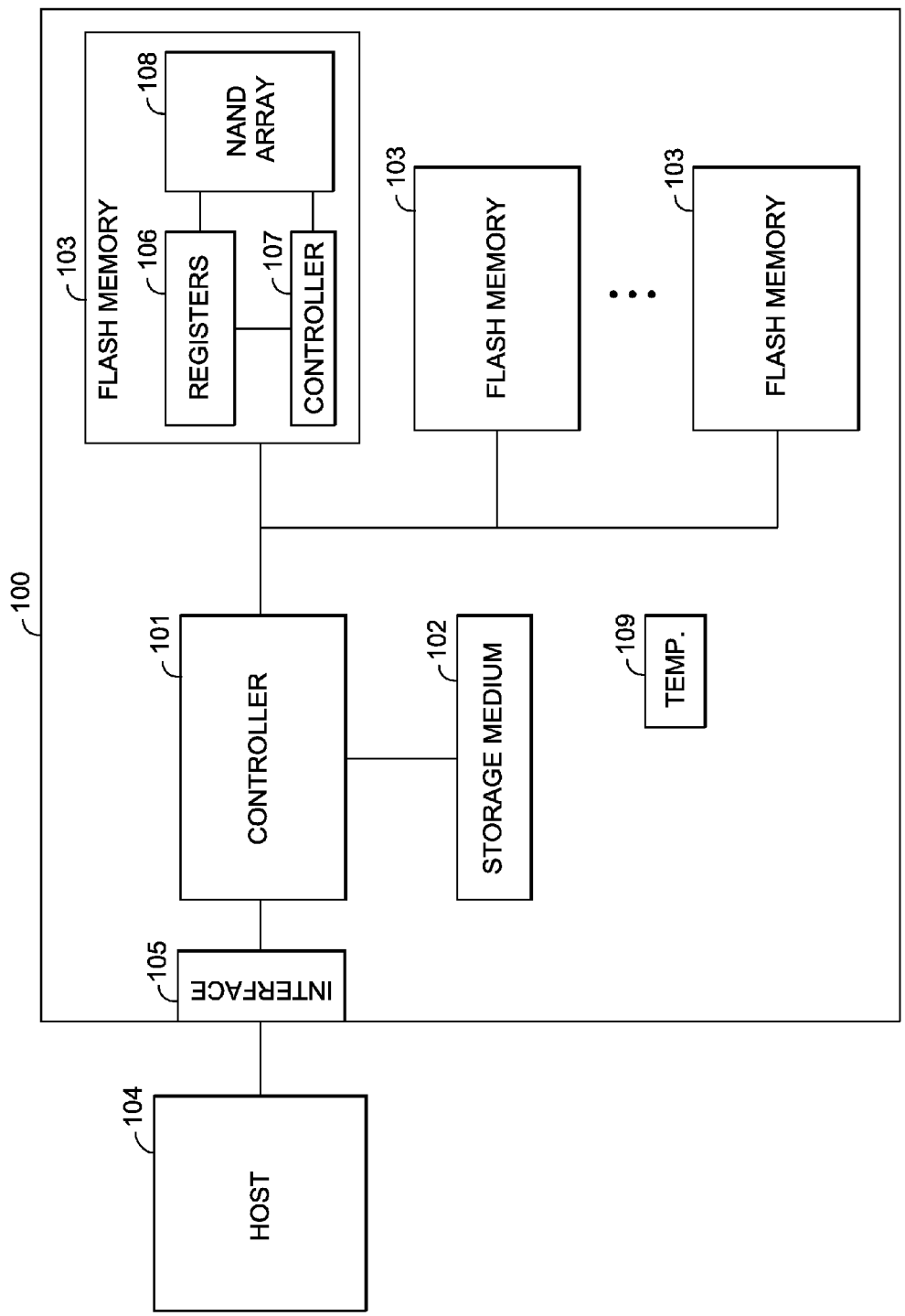
FIG. 1 is a block diagram illustrating components of a data storage system according to one aspect of the subject technology.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be apparent to those skilled in the art that the subject technology may be practiced without these specific details. In some instances, well-known structures and components are shown in block diagram form in order to avoid obscuring the concepts of the subject technology. Like components are labeled with identical element numbers for ease of understanding.

In a flash memory device, for example, with NAND architecture, memory cells are grouped in strings, with each string consisting of a set of transistors connected in series between a drain select transistor, connected to a bit line of the memory block, and a source select transistor, connected to a reference voltage distribution line. Each memory cell includes a floating-gate MOS transistor. When programming a memory cell, electrons are injected into the floating-gate, for example, by means of Fowler-Nordheim (F-N) Tunneling and/or hot-electron injection. The non-volatility of the cell is due to the electrons maintained within the floating-gate. Bits are stored by trapping charge on the floating gate (an electrically isolated conductor) which stores a logic value defined by its threshold voltage (read threshold) commensurate with the electric charge stored. When the cell is erased, the electrons in the floating gate are pulled off by quantum tunneling (a tunnel current) from the floating gate to, for example, the source and/or substrate.

As a flash memory is cycled (that is, programmed and erased repeatedly), its physical qualities change. For example, the repeated placement and removal of electrons on the floating gate during programming and erase operations, respectively, causes some excess electrons to be trapped in the device. Also, when one or multiple cells are programmed, adjacent cells may experience an unexpected and undesired charge injection to their floating gates, thus leading to corruption of data stored therein. For instance, electrons may leak into neighboring cells after prolonged stress due to the voltages at the gates of neighboring cells. The threshold voltages of these memory cells may eventually take values that are different (higher or lower) than expected values, causing errors when the data is read. Generally, the damage done becomes a function of the field strength (voltage) and duration; that is, programming the flash memory to high threshold voltage conditions increases the rate of damage arising from both program and erase processes because it requires longer duration and/or higher applied fields. For instance, adding enough electrons can change a cell from an erased state to a programmed state.

In NAND architecture, it has been found that the problem of degradation is especially problematic because each transistor in the string of the cells being read receives an elevated voltage stress. Read retry capability has been introduced to perform data re-read when read errors exceed error correction capability, however, read performances are only further degraded by the number of read retries performed. Endurance has been sacrificed to meet the requirements of mainstream consumer flash application which are low cost (maximum bits in each cell), long retention time (for example, extended dwell time), fast programming/erase, and low error rate to work with unsophisticated controllers. Contrary to industry practice, the subject technology provides a system and process for use in flash memory cell architectures that uses prediction and estimation of read levels to reduce the number of read retries, thereby improving the reliability and endurance of flash memory making it suitable for enterprise applications.

FIG. 1 is a block diagram illustrating components of a data storage system according to one aspect of the subject technology. As depicted in FIG. 1, in some aspects, data storage system 100 (for example, a solid state drive) includes data storage controller 101, storage medium 102, and flash memory 103. Controller 101 may use storage medium 102 for temporary storage of data and information used to manage data storage system 100. Controller 101 may include several internal components (not shown) such as a read-only memory, a flash component interface (for example, a multiplexer to manage instruction and data transport along a serial connection to flash memory 103), an I/O interface, error correction circuitry, and the like. In some aspects, all of these elements of controller 101 may be integrated into a single chip. In other aspects, these elements may be separated on their own PC board.

Controller 101 may also include a processor that may be configured to execute code or instructions to perform the operations and functionality described herein, manage request flow and address mappings, and to perform calculations and generate commands. The processor of controller 101 may be configured to monitor and/or control the operation of the components in data storage controller 101. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 101 and/or its processor. One or more sequences of instructions may be software stored and read from storage medium 102, flash memory 103, or received from host device 104 (for example, via host interface 105). ROM, storage medium 102, flash memory 103, represent examples of machine or computer readable media on which instructions/code executable by controller 101 and/or its processor may be stored. Machine or computer readable media may generally refer to any medium or media used to provide instructions to controller 101 and/or its processor, including volatile media, such as dynamic memory used for storage media 102 or for buffers within controller 101, and non-volatile media, such as electronic media, optical media, and magnetic media.

In some aspects, controller 101 may be configured to store data received from a host device 104 in flash memory 103 in response to a write command from host device 104. Controller 101 is further configured to read data stored in flash memory 103 and to transfer the read data to host device 104 in response to a read command from host device 104. As will be described in more detail below, controller 101 is also configured to predict when current read levels and/or settings are suspect and to estimate new read levels when it is predicted that the current read levels and/or settings need to be changed. If the estimated read levels are proven to be insufficient, controller 101 may be configured to perform further iterative adjustments to correct the read level parameters. By dynamically adjusting read levels of the memory 103, the subject technology may extend the number of P/E operations that may be performed on memory cells within flash memory 103 in a particular application environment, and increase the endurance of the memory cells compared to the same application environment operating without the ability to dynamically adjust read levels.

Host device 104 represents any device configured to be coupled to data storage system 100 and to store data in data storage system 100. Host device 104 may be a computing system such as a personal computer, a server, a workstation, a laptop computer, PDA, smart phone, and the like. Alternatively, host device 104 may be an electronic device such as a digital camera, a digital audio player, a digital video recorder, and the like.

In some aspects, storage medium 102 represents volatile memory used to temporarily store data and information used to manage data storage system 100. According to one aspect of the subject technology, storage medium 102 is random access memory (RAM) such as double data rate (DDR) RAM. Other types of RAM also may be used to implement storage medium 102. Memory 102 may be implemented using a single RAM module or multiple RAM modules. While storage medium 102 is depicted as being distinct from controller 101, those skilled in the art will recognize that storage medium 102 may be incorporated into controller 101 without departing from the scope of the subject technology. Alternatively, storage medium 102 may be a non-volatile memory such as a magnetic disk, flash memory, peripheral SSD, and the like.

As further depicted in FIG. 1, data storage system 100 may also include host interface 105. Host interface 105 may be configured to be operably coupled (for example, by wired or wireless connection) to host device 104, to receive data from host device 104 and to send data to host device 104. Host interface 105 may include electrical and physical connections, or a wireless connection, for operably coupling host device 104 to controller 101 (for example, via the I/O interface of controller 101). Host interface 105 may be configured to communicate data, addresses, and control signals between host device 104 and controller 101. Alternatively, the I/O interface of controller 101 may include and/or be combined with host interface 105. Host interface 105 may be configured to implement a standard interface, such as Serial-Attached SCSI (SAS), Fiber Channel interface, PCI Express (PCIe), SATA, USB, and the like. Host interface 105 may be configured to implement only one interface. Alternatively, host interface 105 (and/or the I/O interface of controller 101) may be configured to implement multiple interfaces, which may be individually selectable using a configuration parameter selected by a user or programmed at the time of assembly. Host interface 105 may include one or more buffers for buffering transmissions between host device 104 and controller 101.

Flash memory 103 represents a non-volatile memory device for storing data. According to one aspect of the subject technology, flash memory 103 includes, for example, a NAND flash memory. Flash memory 103 may include a single flash memory device or chip, or, as depicted by FIG. 1, may include multiple flash memory devices or chips arranged in multiple channels. Flash memory 103 is not limited to any particular capacity or configuration. For example, the number of physical blocks, the number of physical pages per physical block, the number of sectors per physical page, and the size of the sectors may vary within the scope of the subject technology.

Flash memory may have a standard interface specification. This standard ensures that chips from multiple manufacturers can be used interchangeably (at least to a large degree). The interface hides the inner working of the flash and returns only internally detected bit values for data. In one aspect, the interface of flash memory 103 is used to access one or more internal registers 106 and an internal flash controller 107 for communication by external devices. In some aspects, registers 106 may include address, command, and/or data registers, which internally retrieve and output the necessary data to and from a NAND memory cell array 108. For example, a data register may include data to be stored in memory array 108, or data after a fetch from memory array 108, and may also be used for temporary data storage and/or act like a buffer. An address register may store the memory address from which data will be fetched to host 104 or the address to which data will be sent and stored. In some aspects, a command register is included to control parity, interrupt control, and the like. In some aspects, internal flash controller 107 is accessible via a control register to control the general behavior of flash memory 103. Internal flash controller 107 and/or the control register may control the number of stop bits, word length, receiver clock source, and may also control switching the addressing mode, paging control, coprocessor control, and the like.

In some aspects, registers 106 may also include a test register. The test register may be accessed by specific addresses and/or data combinations provided at the interface of flash memory 103 (for example, by specialized software provided by the manufacturer to perform various tests on the internal components of the flash memory). In further aspects, the test register may be used to access and/or modify other internal registers, for example the command and/or control registers. In some aspects, test modes accessible via the test register may be used to input or modify certain programming conditions of flash memory 103 (for example, read levels) to dynamically vary how data is read from the memory cells of memory arrays 108.

Figure 2:
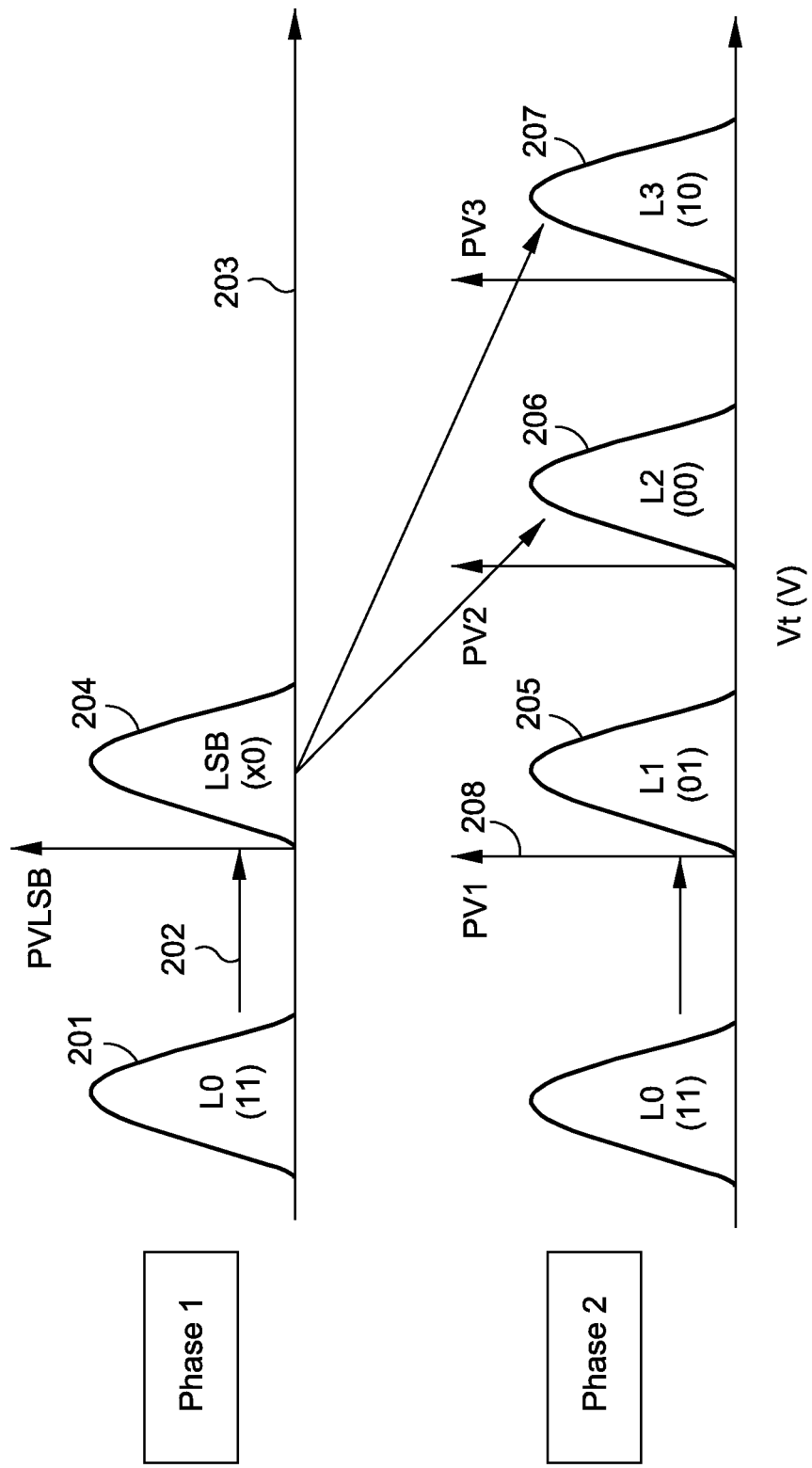
FIG. 2 is a diagram illustrating an exemplary graph diagram of four possible cell $V_T$ distributions and complimentary program verify levels for a group of memory cells in a multi-level cell flash memory according to one aspect of the subject technology.

The storage capacity of SSDs can be increased using MLC NAND flash memory. MLC provides for more than one bit per cell by choosing between multiple levels of electrical charge (read level) to apply to the floating gates of its cells to achieve multiple states of conductivity, each occurring at a different voltage threshold $V_T$. FIG. 2 is a diagram illustrating an exemplary graph diagram of four possible cell $V_T$ distributions and complimentary program verify levels for a group of memory cells in a multi-level cell flash memory according to one aspect of the subject technology. As depicted, a MLC NAND cell is capable of storing four states (levels of charge) per cell, yielding two logical bits of information per cell: the Most Significant Bit (MSB) and Least Significant Bit (LSB). These two bits may make up corresponding MSB and LSB pages of a memory block.

In some aspects, a NAND memory block is programmed one page at a time using an Incremental Step Programming Procedure (ISSP) and erased using a similar Incremental Step Erase Procedure (ISEP). In some aspects, the ISPP and/or ISEP may be performed by flash controller 107 in response to one or more commands received from controller 101. For example, the memory cells that are to be programmed may be selected at the bit line. A "page operation" may be performed to apply a voltage at the gates of each cell in the memory page. A corresponding selection at the bit lines creates a voltage potential in the selected group of memory cells where the LSB is selected to be different (for example, binary 10 or 00) than the erased L0 distribution state 201 (for example, binary 11). Accordingly, ISPP increases 202 the threshold voltage $V_T$ 203 in the floating gates of the selected group of cells to create LSB distribution 204. Then, in a similar manner, during a MSB page program operation, ISPP is applied to create an L1 distribution 205 from the erased L0 distribution 201 (for example, binary 01), or, an L2 distribution 206 (for example, binary 00) or L3 distribution 207 (for example, binary 10) from the previously programmed LSB distribution 204. In some aspects, all of the above distributions are created from L0 distribution 201 by applying a series of ISPP voltage pulses to the memory cells of the page which is being programmed. In some aspects, the ISPP includes a series of voltage pulses that are applied in a step pattern with the amplitude of each pulse incrementally increased with increasing pulse number, starting from a certain starting magnitude. In some aspects, flash controller 107 of flash memory 103 may perform a programming verification (sensing) operation in between each step. Alternatively, this verification operation may be performed after a specific number of steps (the number of steps, for example, being stored on storage medium 102). To verify a cell has been successfully programmed, controller 107 applies a program verify voltage 208 in an attempt to conduct the cell. In some aspects, if the threshold voltage of a cell in the memory page is detected above a certain program verify level, flash controller 107 may stop further programming of that single cell by setting it to a program inhibit state.

In some aspects, LSB and MSB programming use different values of ISPP starting magnitude and/or ISPP step magnitude. Accordingly, a different ISPP step and/or starting magnitudes can be used during the MSB programming of L1 distribution 205 than in the programming of L2 distribution 206 and/or L3 distribution 207. This is because programming to a higher $V_T$ level requires the application of a higher programming voltage potential. It has been found that higher programming pulse magnitudes result in faster programming, and smaller ISPP step magnitudes and/or narrower pulse widths result in narrower final $V_T$ distributions (for example, a distribution of cells programmed to the same $V_T$ having a smaller standard deviation). In some aspects, these parameter values may be stored in storage medium 102 and accessed by controller 101 to determine (for example, calculate) further values and/or issue commands to flash memory 103. Controller 101 may be configured to communicate with flash memory 103 via registers 106 (for example, the test register) and/or flash controller 107 to provide commands for modifying certain parameters (for example, nominal parameters set by the chip manufacturer) of flash memory 103 to vary the $V_T$ distributions at run-time and/or to vary the voltages applied to conduct the memory cells (read levels). As will be further described, these parameters can be dynamically determined and/or adjusted at run-time as a function of various circuit characteristics (for example, P/E cycle, retention time, BER, temperature) and/or in response to commands received from host 104 via host interface 105.

Figure 3:
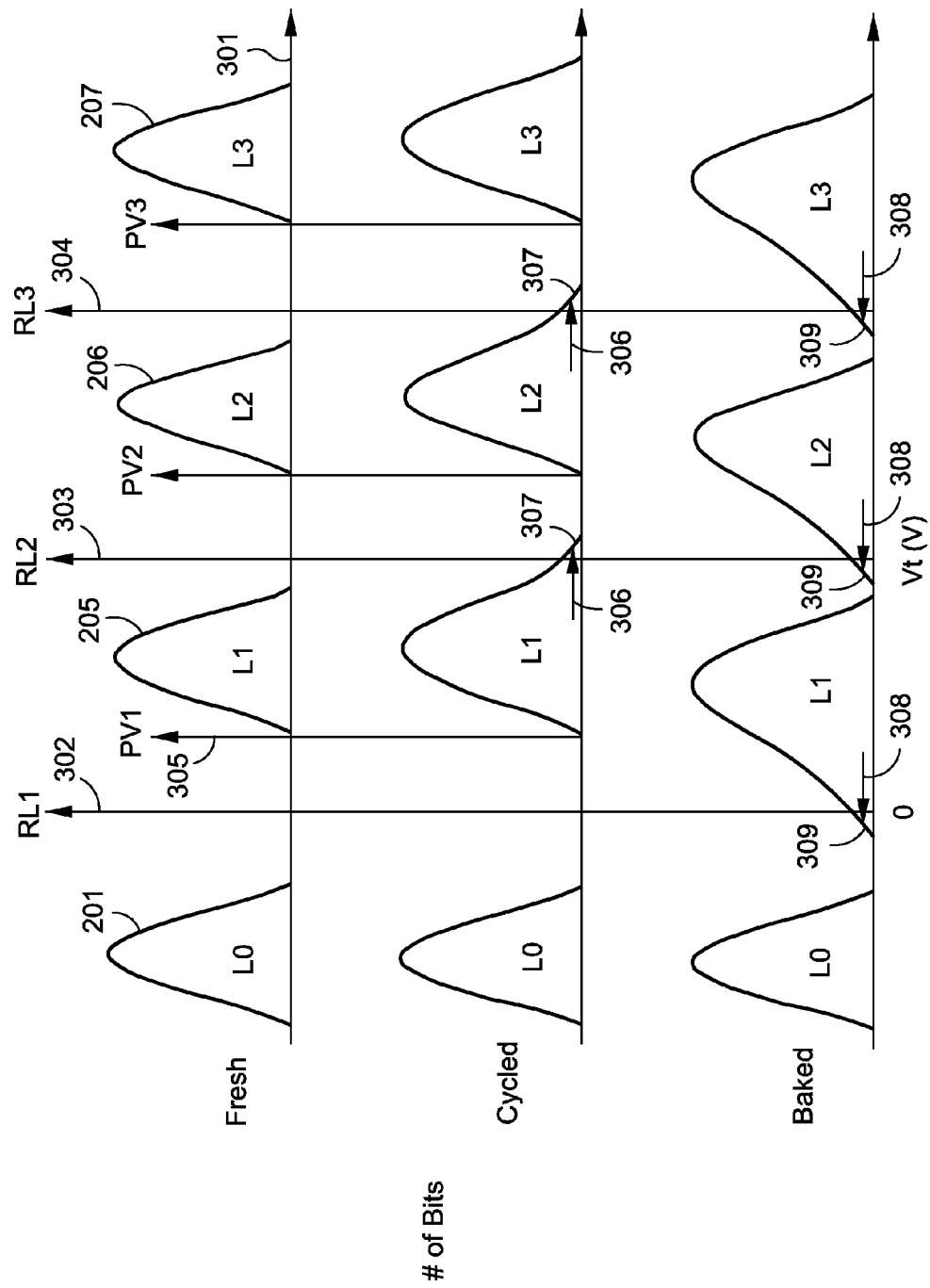
FIG. 3 is a graph diagram illustrating an exemplary threshold voltage evolution of a 2-bit MLC NAND flash memory cell with read levels chosen apriori at beginning of life according to one aspect of the subject technology.

FIG. 3 is a graph diagram illustrating an exemplary threshold voltage evolution of a 2-bit MLC NAND flash memory cell with read levels and program verify levels chosen apriori at beginning of life according to one aspect of the subject technology. The topmost row represents the four possible distributions of each programming state in a group of memory cells at a memory cell's beginning of life (BOL). The respective programming distributions of L0 distribution 201, L1 distribution 205, L2 distribution 206, and L3 distribution 207 are shown along a voltage threshold continuum 301. The middle row of FIG. 3 depicts an exemplary progression of the programming distributions after repeated P/E cycling. The buildup of electrons trapped on the floating gates of the memory cells has caused some cells to be programmed with higher voltage thresholds (increasing the standard deviation of the distribution at a higher $V_T$). This shift 306 in voltage thresholds may eventually cause the right edges of the $V_T$ distributions to reach the higher adjacent read levels. When the $V_T$ of some of the cells in the distributions begin to cross 307 the higher read levels, the likelihood that a read operation will produce an error increases. The bottom row depicts an exemplary result of an extended retention time (for example, dwell time) on the memory cells. After a number of P/E cycles, some of the memory cells that have not been cycled have lost electrons, causing their voltage thresholds to drop (increasing the standard deviation of the deviation at lower $V_T$). This shift 308 may eventually cause the left edges of the $V_T$ distributions to reach the lower adjacent read levels. The more cycles over which data is retained the more extreme the decline. If the read levels remain fixed, the $V_T$ distributions that have crossed 309 the next lower read level may cause significant errors.

With reference to the top row of FIG. 3, after ISPP, the edges of each of the distributions are suitably spaced from adjacent read levels. In some aspects, spacing can be altered by setting program verify voltages 305 (for example, PV1, PV2, and/or PV3) during the verification operation sufficiently higher than a lower read level, but sufficiently low enough to prevent even those cells in the distribution having the highest $V_T$ (largest deviation) from crossing the next higher read level. To ensure that all cells in a distribution will conduct, a read level voltage greater than the distribution is applied. In this regard, RL1 voltage 302 will cause cells in L0 distribution 201 to conduct, RL2 voltage 303 will cause cells in L1 distribution 205 to conduct, RL3 voltage 304 will cause cells in L2 distribution to conduct, and so on. Where, as depicted by FIG. 3, only four states are available, RL voltage 304 will not cause any cells in L3 distribution 207 to conduct, thereby generating a binary x0 in the LSB (see FIG. 2) for those cells. Generally, for N distributions there will be N−1 read levels. In the depicted example, there are four distributions (of states) and three read levels. Those skilled in the art will recognize that there may be eight, sixteen, or more distributions without departing from the scope of the subject technology.

Read Level Predictor

Controller 101 may be configured to perform certain prediction operations before reading memory 103 to predict whether the last read level voltage used to read data remains at an acceptable value or whether a new read level voltage should be estimated to compensate for a shift in $V_T$ distribution, to reduce BER. In some aspects, these operations may be performed on one or more blocks of memory at a time, however, one skilled in the art will recognize that controller 101 can be manufactured or programmed to perform the operations with regard to any number of cells, including individual cells or one or more pages or strings. In some aspects, controller 101 may be configured to provide the read level prediction in conjunction with estimating a new read level. When used with read level estimation, it has been found that predicting whether a read level should be estimated prior to performing a read operation saves time and power consumption that would otherwise be needed by read level estimations that would occur had the prediction not been performed. Additionally, the cost (time and power) of predicting a read level is specifically less than estimating a read level on every read, and, the chance of success rate has been found to be high, avoiding the cost of a read failure that could otherwise result from not predicting, or mis-predicting, a read level. In one aspect:

$$\text{Prediction Success Rate Target} > 1 - (\text{Prediction Savings/Cost of Misprediction}) \quad (1)$$

Where $$\text{Prediction Savings} = \text{Cost of Estimation} * (1 - \text{Frequency of Estimation}) - \text{Cost of Prediction}$$

Thus, for example, using power as figure of cost, where
  Algorithm computation unit power is 0.1 mW/DMIPS
  Prediction algorithms is 100 instructions or clocks per flash read operation
  Estimation algorithm is 1000 instructions or clocks per flash read operation
  Drive performs 10 k Read/Second
  Frequency of estimation is 5%
results in
  Prediction Power=0.1 mW
  Estimation Power=1 mW
  Misprediction Power=Read Power=100 mW,
and the Prediction Success Rate will have to be equal to greater than 99% {1−[1 mW*(1−5%)−0.1 mW]/100 mW}.

Figure 4:
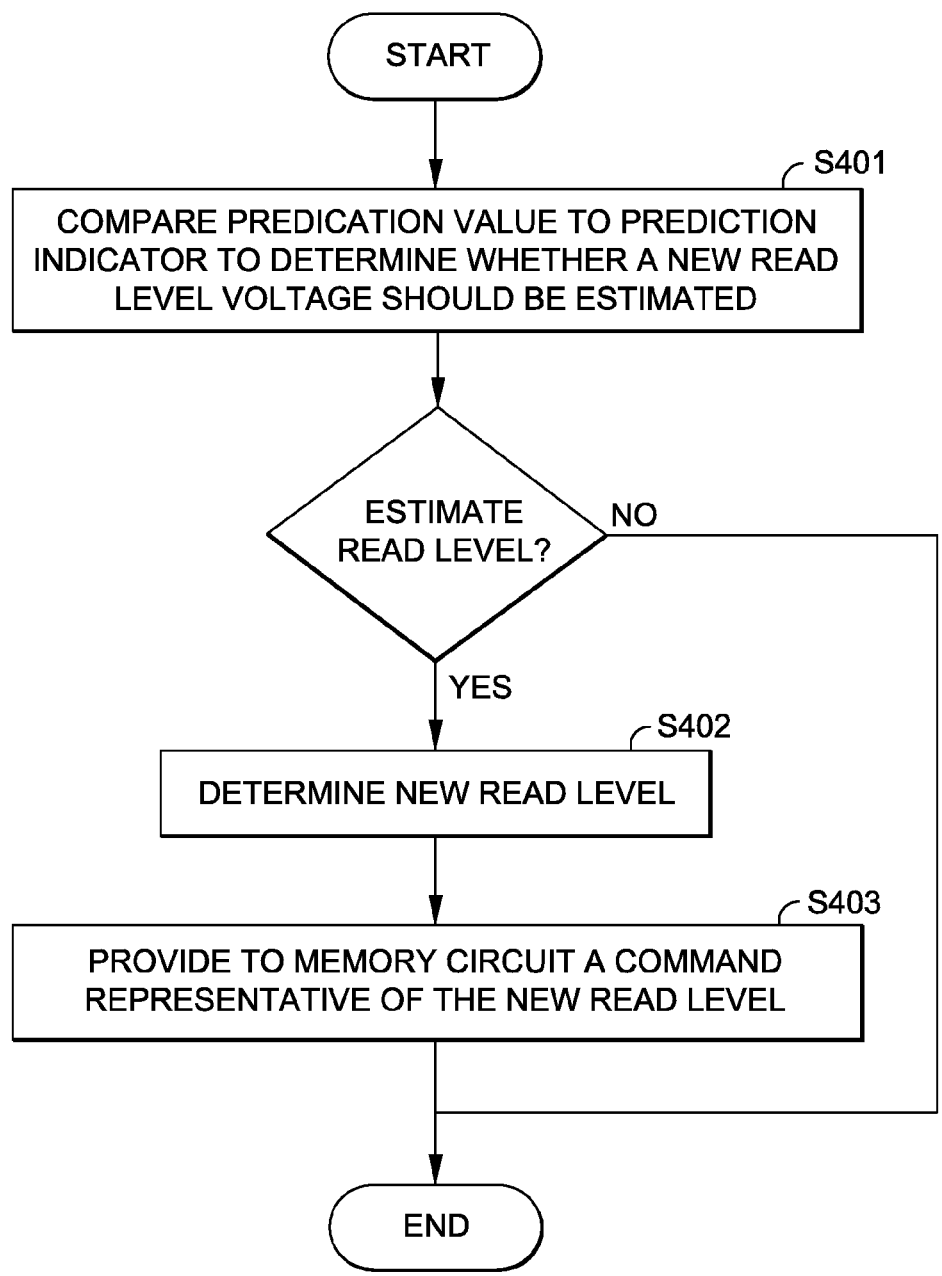
FIG. 4 is a flowchart illustrating a process for predicting when current read levels and/or settings are suspect according to one aspect of the subject technology.

FIG. 4 is a flowchart illustrating a process for predicting when current read levels and/or settings are suspect according to one aspect of the subject technology. Prior to undertaking the estimation procedure, controller 101 receives from host device 104 an instruction representative of a read operation. Controller 101 generates a prediction value, and, in some aspects, determines the prediction value from characteristics associated with the memory block being read. For example, as will be described in more detail below, these characteristics may include whether the last operation on the block was a write operation, whether the page being read is a marginal or critical address, comparing read level margins and read level margin thresholds, and/or a previous read level value (see FIG. 5). In some aspects, controller 101 may be configured to retrieve the prediction value and/or characteristics from a lookup table stored on storage medium 102 or storage medium 103, or the like. Controller 101 further retrieves a prediction indicator from a lookup table stored on storage medium 102. As will be described in more detail below, the prediction indicator may include a Boolean value, a marginal or critical address, read level margin thresholds, a previous read level value, and/or the like. It is not necessary that the prediction value and predication indicator are generated in any particular sequence but, rather, in some aspects, they may be generated in substantially parallel operations.

In step S401, controller 101 performs a compare operation to compare the prediction value to the prediction indicator to determine whether a read level voltage should be estimated. If the result of the compare operation is positive (for example, the prediction value and prediction indicator are equal) then the process proceeds to step S402 to estimate/determine a new read level. Otherwise, the process terminates and a read is performed on the memory using existing read levels and/or parameters. In Step S403, controller 101 generates a programming command representative of the new read level voltage to read the memory cell and provides it to flash memory 103 (for example, via registers 106).

Figure 5:
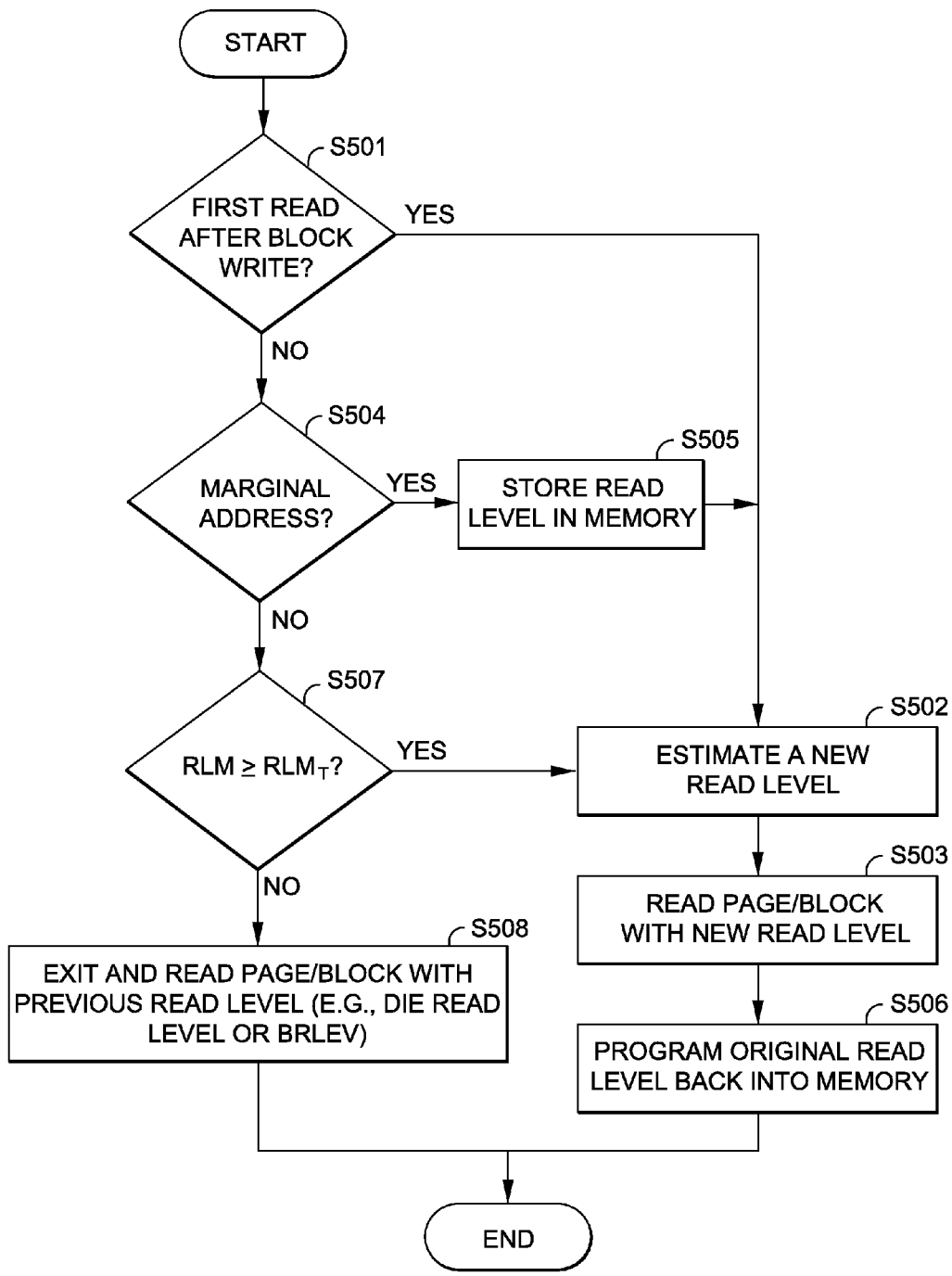
FIG. 5 is a flowchart illustrating an alternative process for predicting when current read levels and/or settings are suspect according to one aspect of the subject technology.

FIG. 5 is a flowchart illustrating an alternative process for predicting when current read levels and/or settings are suspect according to one aspect of the subject technology. Prior to undertaking the process, controller 101 receives an instruction from host device 104 representative of a read operation. In step S501, when reading a block of flash memory 103, controller 101 determines whether the block is being read for the first time after a write operation. In some aspects, prior to this determination, controller 101 sets a Boolean flag associated with the block to TRUE after a write operation (Just Written Flag). Before a read operation is undertaken, controller 101 determines whether the Boolean flag is TRUE, and if so, sets the flag to FALSE and proceeds to step S502 to estimate a new read level. In step S503, the page and/or block is read using the new read level.

Otherwise, if the block is not being read for the first time after a write operation, the process proceeds to step S504. In step S504, controller 101 determines whether the read address is equal to a marginal address stored on a lookup table in storage medium 102 (for example, by XOR with an address mask). In some aspects, a marginal address may be an address that likely needs a specific read level voltage to avoid generating a high BER. Those skilled in the art will recognize techniques and methods for determining which addresses are likely to generate a high BER (for example, from a sector bit error memory map). If the read address is equal to the marginal address the process proceeds to step S502 to estimate a new read level. Prior to estimating the new read level, since the new read level was triggered by an address within the block (for example, the first and last pages of the block), the read level may be temporarily modified so that further read levels for the block remain unchanged. In optional step S505 (designated as by dotted lines), the present read level is temporarily stored in memory (for example, storage medium 102, flash memory 103, or the like), and then the read level estimated in step S502 and the read performed in step S503. Then, in optional step S506 (also designated as by dotted lines), after the read operation has been completed, controller 101 may program the original read level back into memory. In other aspects, if controller 101 determines that the read address is not equal to a marginal address then the process proceeds to step S507.

Prior to step S507, controller 101 determines a Read Level Margin (RLM) value as a function of an error level value from a previous read, and a number of program/erase (P/E) cycles. In one aspect, RLMs reduce as read error levels increase and P/E cycles increase. In some aspects, controller 101 determines the error level value as a function of a quality of a previous read operation. Taking $K_{EL}$ as a factor associated with Error Level (EL), where EL is a measure of the quality of a previous read operation (for example, the number of bits in error per sector and/or page data read):

$$K_{EL} = K_{EL0} \text{ if } 0 < EL < EL_1; \quad (2)$$

$$K_{EL1} \text{ if } EL_1 < EL \leq EL_2;$$

$$K_{EL2} \text{ if } EL_2 < EL \leq EL_3; \text{ and}$$

$$K_{EL3} \text{ if } EL_3 < EL;$$

where, for example:

$$K_{EL0}=1, K_{EL1}=2, K_{EL2}=4; K_{EL3}=8;$$

$EL_1=1$ bit/512 Byte, $EL_2=3$ bit/512 Byte, $EL_3=5$ bit/512 Byte.

Taking $K_{PE}$ as a factor associated to a range of P/E cycles:

$$K_{PE} = K_{PE0} \text{ if } 0 < P/E < PE_1; \quad (3)$$

$$K_{PE1} \text{ if } PE_1 < P/E \leq PE_2;$$

$$K_{PE2} \text{ if } PE_2 < P/E \leq PE_3; \text{ and}$$

$$K_{PE3} \text{ if } PE_3 < P/E;$$

where, for example:

$$K_{PE0}=1, K_{PE1}=2, K_{PE2}=4; K_{PE3}=8; \text{ and}$$

$PE_1=5$ k P/E, $PE_2=10$ k P/E, $PE_3=20$ k P/E.

Therefore, in one aspect, $RLM=K_{EL} \times K_{PE}$. The values associated with $K_{EL}$ and $K_{PE}$ may be indexed by their respective ranges and stored in one or more look up tables (for example, on storage medium 102). Controller 101 may access the one or more look up tables to compare the number of error bits generated from the previous read operation to the Error Level ranges to generate $K_{EL}$, and compares the current number of P/E cycles to the P/E ranges to generate $K_{PE}$. In step S507, controller 101 determine whether the calculated RLM is greater or equal to a Read Level Margin threshold ($RLM_T$). If it is then the process proceeds to step S502 to estimate a new read level. Otherwise, if RLM is less than $RLM_T$, the process proceeds to step S508 and the previous read level is used. Table 1 is an exemplary lookup table of RLM thresholds:

TABLE 1

Lookup Table of RLM Thresholds

| RLM | $0 < EL < EL_1$ | $EL_1 < EL \leq EL_2$ | $EL_2 < EL \leq EL_3$ | $EL_3 < EL$ |
|---|---|---|---|---|
| $0 < P/E < PE_1$ | 1 | 2 | 4 | 8 |
| $PE_1 < P/E \leq PE_2$ | 2 | 4 | 8 | 16 |
| $PE_2 < P/E \leq PE_3$ | 4 | 8 | 16 | 32 |
| $PE_3 < P/E$ | 8 | 16 | 32 | 64 |

In some aspects, Table 1 is an exemplary lookup table stored on storage medium 102 which stores RLM values corresponding to EL range limits $EL_1$, $EL_2$, and $EL_3$, and P/E cycle range limits $PE_1$, $PE_2$, and $PE_3$. In the above example, $RLM_T$ is set at 16. Thus, in this example, if controller 101 determines RLM to be greater than 16 then it will predict that a new read level should be estimated, otherwise, controller 101 will proceed with a read operation using the previous read level.

In one aspect, a $RLM_T$ value is stored for each block. In other aspects, one or more $RLM_T$ values may be stored for a group of blocks or all blocks. In some aspects, storage medium 102 will be sufficient to save the number of error bits generated from the previous read operation and the previous Block Read Level Value (BRLEV) for each block. If controller 101 changes a BRLEV at the completion of a read, controller 101 stores the BRLEV for use by a future read operation for the same block. In some aspects, where BRLEV is defined on a block by block basis, controller 101 does not have to account for a variation across all blocks and $RLM_T$ can take on a higher value, for example, $RLM_T=32$, thereby reducing the frequency of Read Level estimation and thus computations over P/E cycles and Error Level.

In other aspects, storage medium 102 will not be sufficient to save the read level for each block. On startup, controller 101 may access flash memory 103 to retrieve a nominal read level (for example, from the test register) and store and/or use that value for all read predictions across all blocks (die read level), or use a default value(s) set within software executed by controller 101. Since $RLM_T$ may account for block to block read variations, $RLM_T$ may take on a higher value, for example, $RLM_T=16$, resulting in more frequent estimation of new read levels as P/E cycles and Error Levels increase.

Read Level Estimator

Figure 6:
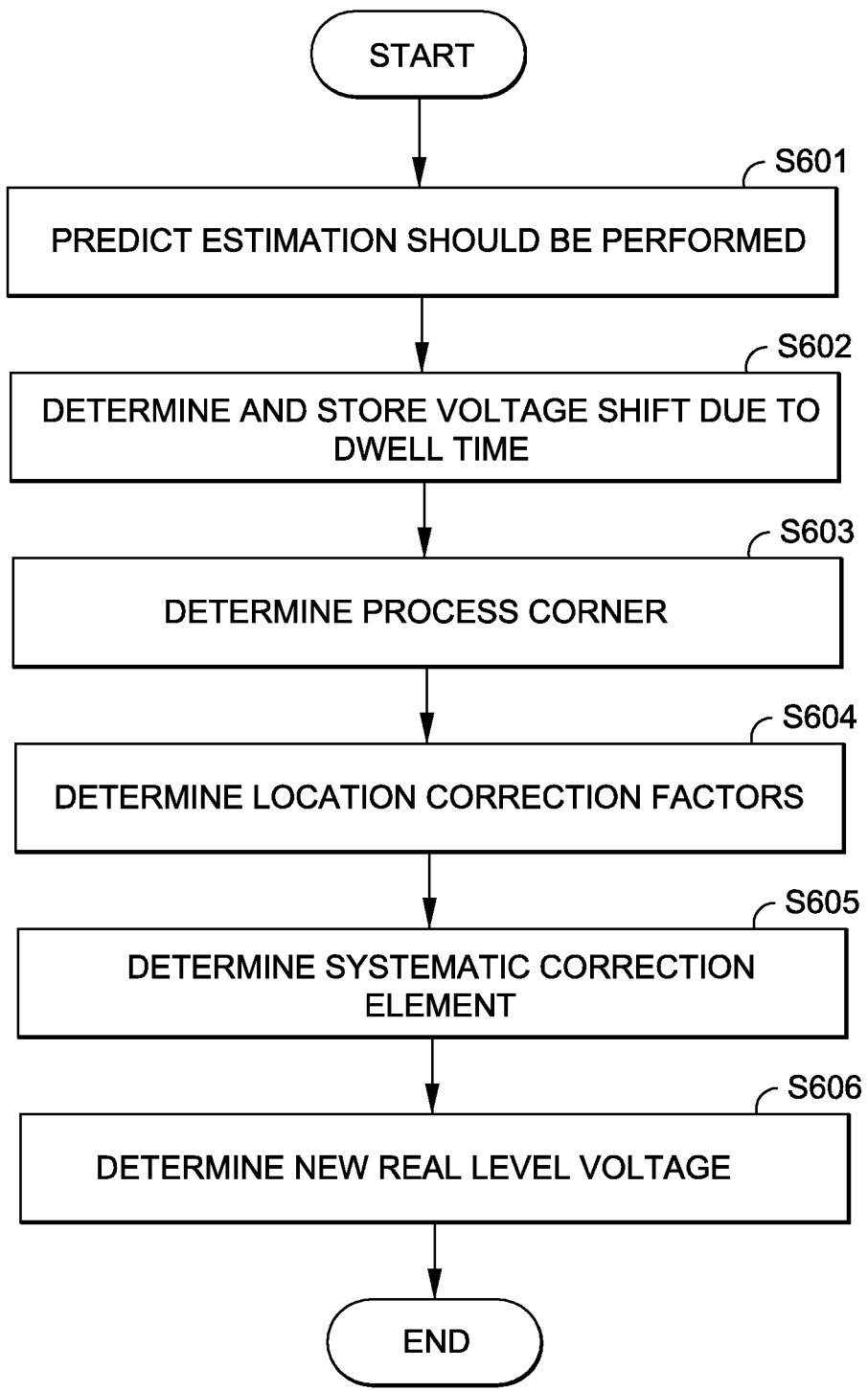
FIG. 6 is a flowchart illustrating a process for estimating a Read Level (RL) voltage to apply to the memory cells of a memory block according to one aspect of the subject technology.

FIG. 6 is a flowchart illustrating a process for estimating a read level voltage to apply to the memory cells of a memory block according to one aspect of the subject technology. In step S601, controller determines that a new read level voltage should be estimated (see FIGS. 4 and 5). In step S602, a Voltage Shift due to Dwell Time ($\Delta V_{DT}$) is determined (for example, calculated) and stored in storage medium 102 for the block being read. In some aspects, $\Delta V_{DT}$ is the optimal $V_T$ shift needed to correct a distribution of cells at nominal process conditions and nominal case temperature for different P/E cycles and dwell times. As will be described below, $\Delta V_{DT}$ values may be a result of a flash memory characterization and stored in a lookup table on storage medium 102. The number of columns and rows of the lookup table depends on the number of P/E cycle and dwell time ranges to be covered, and $\Delta V_{DT}$ precision. Storage medium 102 may also include other information relative to $\Delta V_{DT}$ that is updated periodically, for example, setting and/or storing a Block Time Stamp (representative of the Dwell Time) for each block on each read operation performed on the memory block.

Figure 7:
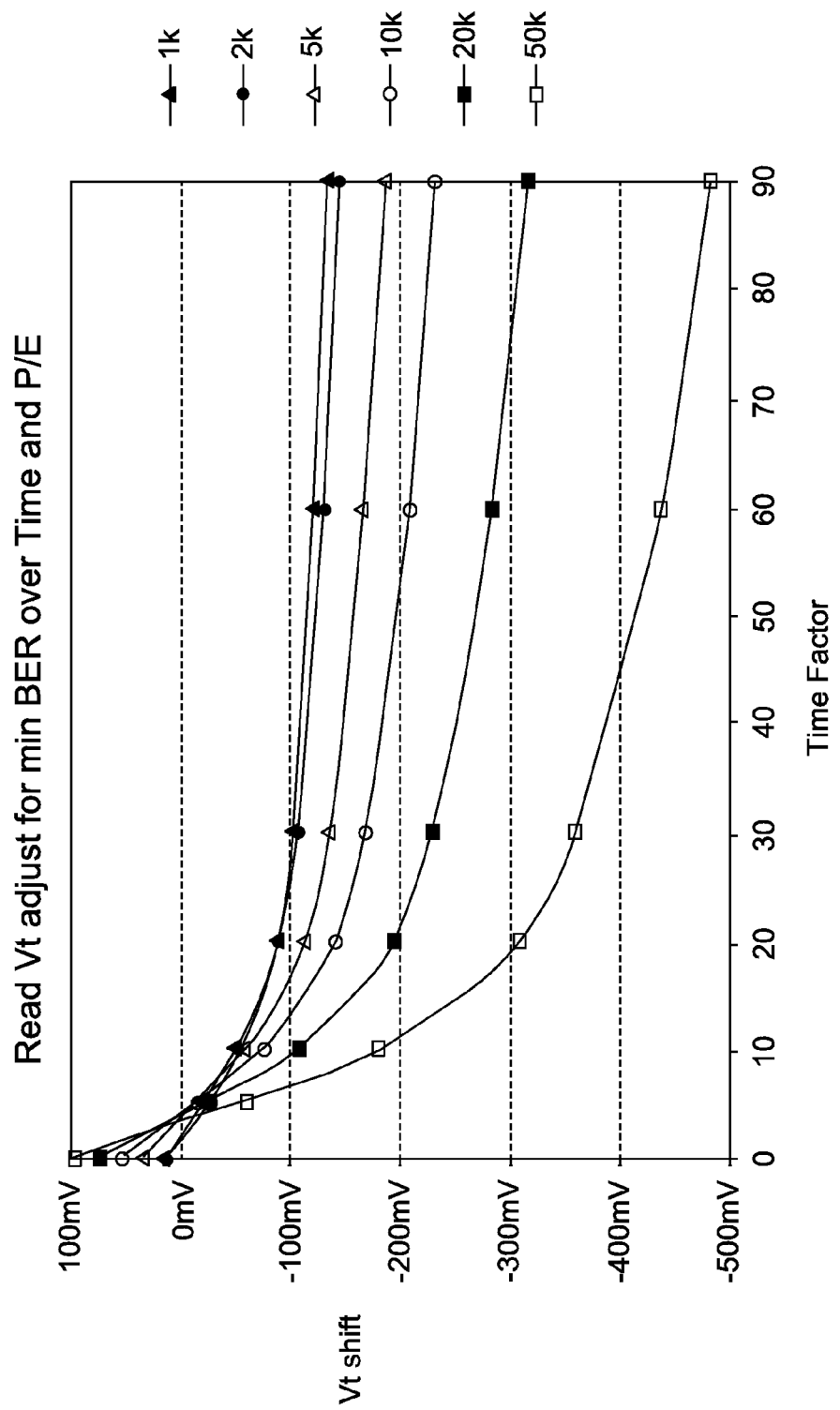
FIG. 7 is an exemplary characterization of a 41 nm MLC flash memory depicting a $V_T$ shift (mV) at predetermined intervals to achieve a minimum BER over the life of the memory according to one aspect of the subject technology.

Turning briefly to FIG. 7, an exemplary characterization of a 41 nm MLC flash memory is shown depicting a $V_T$ shift (mV) at predetermined intervals to achieve a minimum BER over the life of the memory (for example, a number of P/E cycles) according to one aspect of the subject technology. From this exemplary characterization seven dwell time ranges with quadratic values can be identified. Table 2 is an exemplary lookup table with dwell time ranges defined from 1× to 128× cross-referenced with eight P/E cycle intervals.

TABLE 2

| $\Delta V_{DT}$ Lookup Table (mV) | | | | | | | | |
|---|---|---|---|---|---|---|---|---|
| $\Delta V_{DT}$ | 1x | 2x | 4x | 8x | 16x | 32x | 64x | 128x |
| 2k | 0 | 0 | −50 | −100 | −100 | −100 | −100 | −100 |
| 5k | 0 | 0 | −50 | −100 | −150 | −150 | −200 | −200 |
| 10k | 50 | 0 | −50 | −150 | −200 | −200 | −300 | −300 |
| 20k | 50 | 0 | −100 | −150 | −300 | −300 | −400 | −400 |
| 30k | 100 | −50 | −100 | −200 | −350 | −350 | −400 | −400 |

TABLE 2-continued

| $\Delta V_{DT}$ Lookup Table (mV) | | | | | | | | |
|---|---|---|---|---|---|---|---|---|
| $\Delta V_{DT}$ | 1x | 2x | 4x | 8x | 16x | 32x | 64x | 128x |
| 40k | 100 | −50 | −150 | −250 | −400 | −400 | −450 | −450 |
| 50k | 100 | −50 | −200 | −300 | −450 | −450 | −500 | −500 |
| 60k | 100 | −50 | −250 | −350 | −500 | −500 | −550 | −600 |

In the above example, 1× Dwell Time corresponds to ½ hour at a Reference Temperature 75 C. For instance, after 30 k cycles, a 2 hour dwell time will produce a −100 mV shift. This allows for covering up to 64 hours, or 2.6 days, time, for which the $V_T$ distribution shift is minimal at even a high number of P/E cycles. In one aspect of enterprise applications, the probability of data lifetimes exceeding 2.5 days has been found to be relatively low, and for which additional read failure recovery mechanisms may be acceptable (for example, ECC). One skilled in the art will recognize how to adapt the above characterization to other flash memory devices. Accordingly, once flash memory 103 has been characterized the $\Delta V_{DT}$ lookup table can be populated and stored on storage medium 102.

In some aspects, dwell times are first converted to the dwell time scale of Table 2 based on the temperature of data storage system 100 (for example, actual drive temperature). Storage system 100 includes an internal temperature sensor 109 (for example, a thermocouple or thermometer) that provides system 100 with a drive operating temperature ($T_S$) measured at a reference location. A Temperature Conversion Factor ($AF_{T=75C}$) is obtained by the Arrhenius equation to statistically predict and model a shift acceleration due to temperature:

$$AF_T = e^{\frac{Ea}{k}\left(\frac{\pi}{T_0} - \frac{\pi}{T_S}\right)} \quad (4)$$

where
k=Boltzmann's constant=8.617×10⁻⁵ eV/K;
$T_0$=75 C reference temperature (K);
$T_S$=actual drive operating temperature (K); and
Ea=activation energy for the respective failure mechanism: 1.1 eV for NAND flash technology.

In one aspect, the block's dwell time is multiplied by $\Delta F_T$ prior to referencing the lookup table represented by Table 2 to more accurately predict $\Delta V_{DT}$ as a function of drive temperature. In further aspects, rather than determining $AF_T$ at runtime, storage system 100 may store a lookup table on storage medium 102 that includes $AF_T$ values. Table 3 is an exemplary list of $AF_T$ values calculated for different temperatures at Ea=1.1 eV:

TABLE 3

| Lookup Table of $AF_T$ values | | | | | | | | |
|---|---|---|---|---|---|---|---|---|
| | | | | $T_S$ | | | | |
| $AF_T$ | | 40 | 55 | 60 | 65 | 70 | 75 | 80 | 85 |
| $T_0$ | 40 | 1 | 6.4 | 11.6 | 20.4 | 35 | 60 | 101 | 168 |
| | 55 | 1.6E−01 | 1 | 1.8 | 3 | 5 | 9 | 16 | 26 |
| | 60 | 8.7E−02 | 5.6E−01 | 1 | 1.8 | 3 | 5 | 9 | 15 |
| | 65 | 4.9E−02 | 3.2E−01 | 5.7E−01 | 1 | 1.7 | 3 | 5 | 8.2 |
| | 70 | 2.8E−02 | 1.8E−01 | 3.3E−01 | 5.8E−01 | 1 | 1.7 | 3 | 4.7 |
| | 75 | 1.7E−02 | 1.1E−01 | 1.9E−01 | 3.4E−01 | 5.9E−01 | 1 | 1.7 | 2.8 |
| | 80 | 9.9E−03 | 6.4E−02 | 1.1E−01 | 2.0E−01 | 3.5E−01 | 6.0E−01 | 1 | 1.7 |
| | 85 | 6.0E−03 | 3.8E−02 | 6.9E−02 | 1.2E−01 | 2.1E−01 | 3.6E−01 | 6.0E−01 | 1 |

In further aspects, dwell times are converted to the dwell time scale based on the temperature of flash memory 103 (for example, actual die temperature). In this regard, a drive level temperature characterization may require a die temperature variation against the reference location where temperature sensor 109 is located. It has been found that the temperature variation of flash memory 103 may be somewhat independent from the drive temperature provided by internal temperature sensor 109. Therefore, in some aspects, the calculation of $\Delta V_{DT}$ may also include a Die Temperature Adjustment factor ($k_{TF}$) to model Temperature Conversion Factor $AF_T$ as a factor of die temperature. Thus, for example, $$T'_S = T_S \times k_{TF}. \quad (5)$$

Figure 8A:
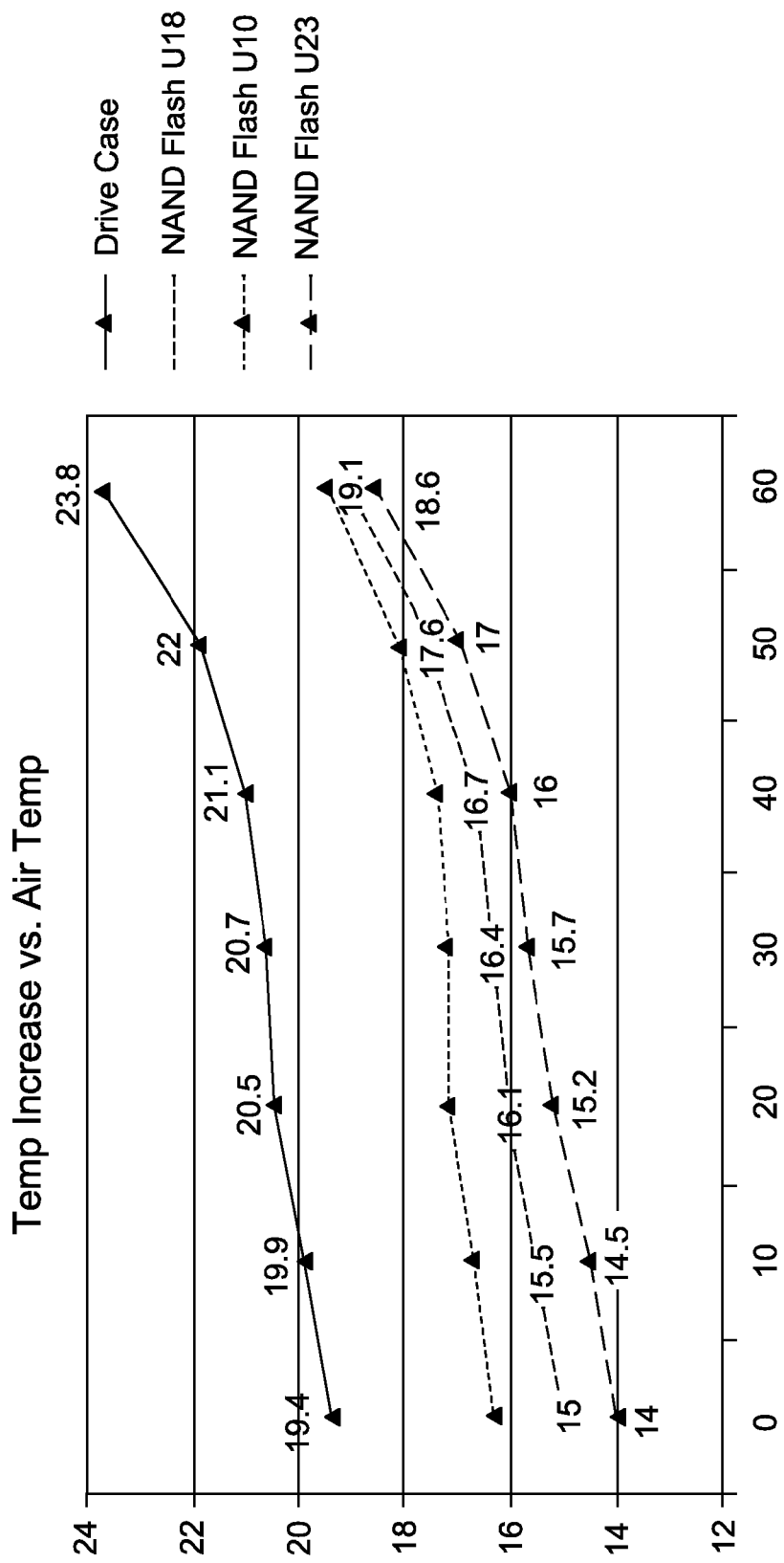
FIG. 8A is a graph diagram illustrating die temperature increase relative to drive temperature increase over predetermined intervals of P/E cycles according to one aspect of the subject technology.

Accordingly, a second lookup table for $k_{TF}$ is provided where $\Delta V_{DT}$ is a function of Temperature Conversion Factor $AF_T$ and Die Temperature Adjustment factor $k_{TF}$ (for example, $\Delta V_{DT}=(P/E, DT, AF_{T=75C} \times k_{TF})$). FIG. 8A is a graph diagram illustrating die temperature increase relative to drive temperature increase over predetermined intervals of P/E cycles according to one aspect of the subject technology. In one aspect, $k_{TF}$ is generated for the increase in die temperature (for example, at memory 103) relative to the drive temperature taken at temperature sensor 109. In some aspects, the data represented in FIG. 8 is stored in one or more lookup tables on storage medium 102. Controller 101 may be configured to index the one or more lookup tables using a drive temperature retrieved from internal temperature sensor 109 to retrieve Die Temperature Adjustment factor $k_{TF}$. From the example of FIG. 8, approximately four different temperature ranges may be defined:

$C_0 = T_{REF}$ to $T_{REF} + 1$ C;

$C_2 = T_{REF} + 1$ C to $T_{REF} + 3$ C;

$C_3 = T_{REF} + 3$ C to $T_{REF} + 5$ C; and $C_6 = T_{REF} + 5$ C to $T_{REF} + 7$ C or more.

In that regard, Table 4 provides an exemplary list of Die Temperature Adjustment factors $k_{TF}$ and their percentage change over 75 C for NAND flash memory at a given drive temperature. Thus, Table 4 can be implemented as a lookup table for $k_{TF}$, indexed by drive temperature value and/or range. The lookup table may be stored on storage medium 102 for access by controller 101 when determining $\Delta V_{DT}$. It has been found that, given the base reference value of 75 C, the error of $AF_T$ determined from Table 4 is within 15% for the range 40 C to 105 C for NAND flash

TABLE 4

Die Temperature Correction Factor

| $C_0$ | $C_2$ | % | $C_4$ | % | $C_6$ | % |
|---|---|---|---|---|---|---|
| 40 | 1 | 1.30 | 5.1% | 1.67 | 10.3% | 2.15 | 15.6% |
| 55 | 1 | 1.27 | 2.7% | 1.60 | 5.3% | 2.01 | 8.0% |
| 60 | 1 | 1.26 | 1.9% | 1.58 | 3.9% | 1.97 | 5.8% |
| 65 | 1 | 1.25 | 1.3% | 1.55 | 2.5% | 1.93 | 3.8% |
| 70 | 1 | 1.24 | 0.6% | 1.54 | 1.2% | 1.90 | 1.8% |
| 75 | 1 | 1.23 | 0.0% | 1.52 | 0.0% | 1.86 | 0.0% |
| 80 | 1 | 1.23 | −0.6% | 1.50 | −1.2% | 1.83 | −1.7% |
| 85 | 1 | 1.22 | −1.1% | 1.48 | −2.3% | 1.80 | −3.3% |
| 90 | 1 | 1.21 | −1.7% | 1.47 | −3.3% | 1.77 | −4.9% |
| 95 | 1 | 1.21 | −2.2% | 1.45 | −4.3% | 1.74 | −6.3% |
| 100 | 1 | 1.20 | −2.7% | 1.44 | −5.2% | 1.72 | −7.7% |
| 105 | 1 | 1.19 | −3.1% | 1.42 | −6.1% | 1.69 | −9.0% |

Turning back to FIG. 6, in addition to determining Voltage Shift due to Dwell Time ($\Delta V_{DT}$), in step S603, controller 101 determines a process corner factor as a function of a nominal process corner associated with flash memory 103 and a number of P/E cycles. Process corners represent the extremes of parameter variations within which a flash memory circuit must function correctly. Process variations during the manufacture of the flash memory device may result in different electrical parameters which may affect device characteristics, including data retention. In one aspect, a process variation may cause a $\Delta V_{DT}$ shift acceleration over time and temperature. To model this effect, a $\Delta V_{DT}$ Shift Acceleration Factor ($k_{PC}$) may be defined at different P/E cycles for different process corner values and stored on storage medium 102. Table 5 is an exemplary lookup table for determining a process corner factor ($k_{PC}$) as a scaling factor to be used when estimating the new RL voltage. Column S=Slow Corner (−1 s); Column T=Typical Corner (0 s); Column F=Fast Corner (+1 s); and Column FF=Very Fast Corner (+3 s).

TABLE 5

Lookup Table of $k_{PC}$ values for process corner

| $k_{PC}$ | S | T | F | FF |
|---|---|---|---|---|
| 2k | 0.25 | 0.5 | .09 | 3 |
| 5k | 0.3 | 0.6 | 1.8 | 6 |
| 10k | 0.4 | 0.8 | 2.4 | 8 |
| 20k | 0.5 | 1 | 3 | 10 |
| 30k | 0.6 | 1.4 | 4.2 | 14 |
| 40k | 1 | 2 | 6 | 20 |
| 50k | 1.5 | 3 | 9 | 30 |
| 60k | 0.9 | 5 | 15 | 250 |

In addition to process corner factor $k_{PC}$, in step S604, controller 101 determines Location Correction Factors as a function of a Block Location/Address in memory cell array 108 and/or a Page Location/Address in the block. In one aspect, block location and page address result in different variations of $V_T$ shift over P/E cycles. In that regard, flash characterization can provide further address dependency and sensitivity (scaling) factors. Block locations and/or page locations sensitive to $V_T$ shift are stored in one or more lookup tables on storage medium 102, and indexed by P/E cycle or range of P/E cycles. Each block location is associated with a Block Address Factor $k_{BK}$, and each Page Location is associated with a Page Address Factor $k_{PG}$. In some aspects, a logical mask to a flash memory address may be used to identify a page address and/or a block address range(s) to determine what scaling factors to use. Controller 101 may access the one or more lookup tables on storage medium 102 to retrieve factors $k_{BK}$ and $k_{PG}$ and apply those values as factors in estimating the new read level voltage.

In step S605, controller 101 determines a Systematic Correction Factor $S_{CF}$. In some aspects, following a read operation (successful or unsuccessful), controller 101 collects information related to a read operation (for example, BER, $V_T$ used, and the like) to verify the quality of the read operation. If the quality is below a predetermined level (for example, determined by ECC), controller may determine $S_{CF}$ from BER, statistics on errors from previous read operations, $V_T$ displacement from re-read iterations following a read failure, and the like. In one aspect, $S_{CF}$ may be known apriori. For example, they may be determined during a flash read level characterization before product implementation, and/or computed by a procedure executed by controller 101 (or other processor and/or circuit) through post-process read error and read retry operations. When $S_{CF}$ is defined (and/or associated to a block or page location in a block) the $S_{CF}$ is added to the read level estimation (for example, as a read level offset).

Figure 8B:
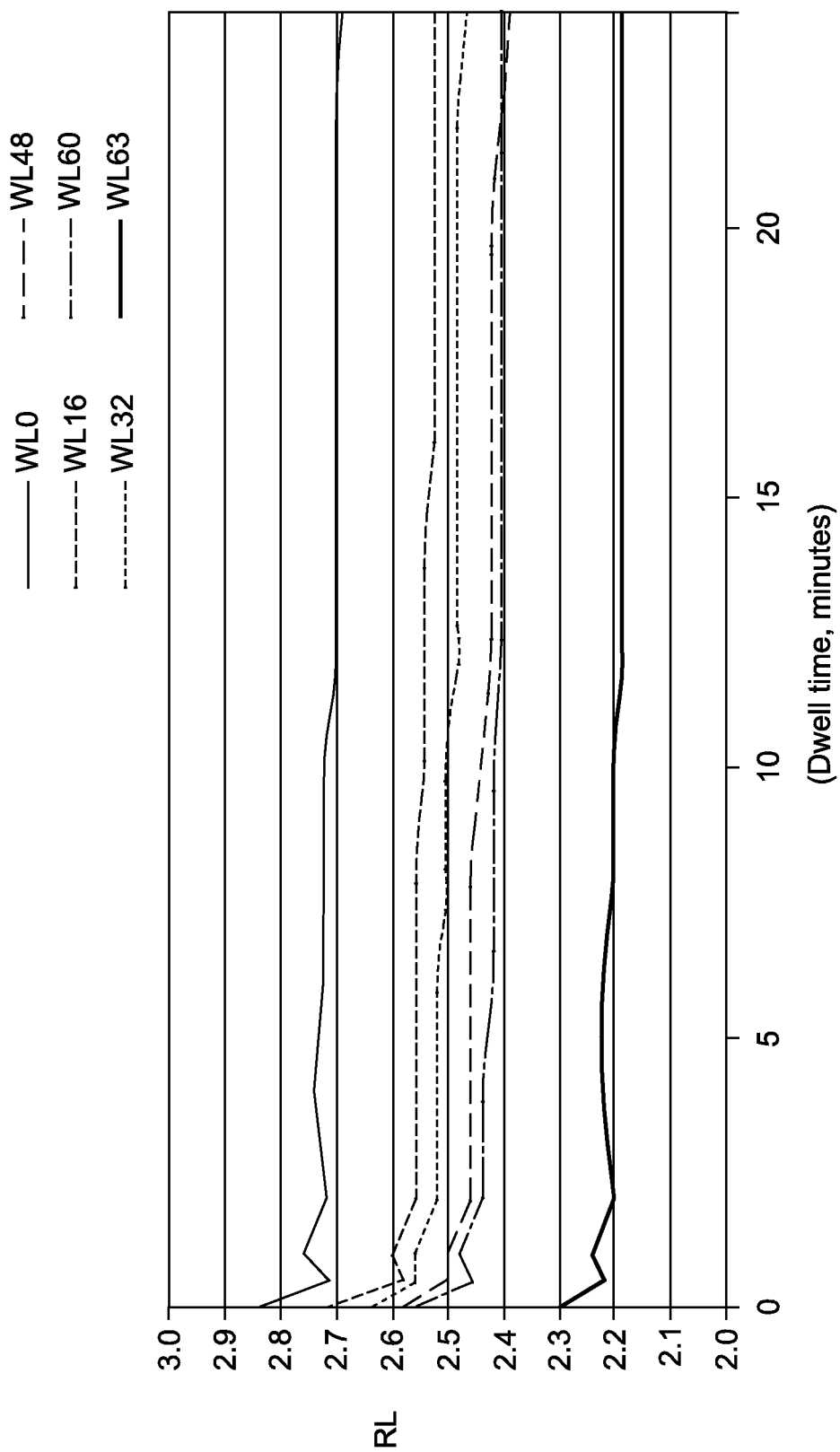
FIG. 8B is a graph diagram illustrating read level offsets for exemplary word lines and their respective pages in a memory block according to one aspect of the subject technology.

FIG. 8B is a graph diagram illustrating read level offsets for exemplary word lines and their respective pages in a memory block according to one aspect of the subject technology. For example, as illustrated by FIG. 8B, pages associated with word line 0 (WL0) may have a $S_{CF}$ of 200 mV versus pages associated with world line 32 (WL32), while pages in word line 63 (WL63) may have a $S_{CF}$ of −300 mV versus pages in word line 32 (WL32). In a further aspect, no correction factor may be required for pages that are within +/−50 mV. The correction factor values may be included in one or more lookup tables (for example, on storage medium 102) and indexed by word line, page and/or block address, and/or the like. In other aspects, controller 101 may be configured to determine $S_{CF}$ values based the information obtained from a previous read operation. Accordingly, controller 101 may include the $S_{CF}$ value in the read level estimation process to compensate for systematic errors.

In step S606, controller 101 determines the read level voltage as a function of the previous Read Level voltage (for example, stored on storage medium 102 or based on a nominal value) and an Estimation Parameter determined (for example, calculated) from the previously described factors. In some aspects, the Estimation Parameter is derived from the formula:

$$\Delta V_{DT} = (P/E, DT, AF_{T=75C} \times k_{TF}) \times k_{PC}(P/E, \text{Corner}) \times k_{BK} \text{(Block Address)} \times k_{PG}\text{(Page Address)} + S_{CF}(\ ). \quad (6)$$

If $RL_{NOM}$ is taken to be the nominal read level from factory settings or a previous read level stored on storage medium 102, then:

$$RL_{EST} = RL_{NOM} + \text{Estimation Parameter}. \quad (7)$$

In some aspects, on determining the estimated Read Level voltage, in step S606, controller 101 programs flash memory 103 by setting the data and/or command registers of flash registers 106 (for example, the flash test registers), and/or sends commands to flash controller 107. In some aspects, the settings and/or programming commands are representative of the read level voltage. In further aspects, flash memory 103 sets $RL_{EST}$ for the specific block/page of memory array 108 based on register values programmed into internal registers 106.

Figure 9:
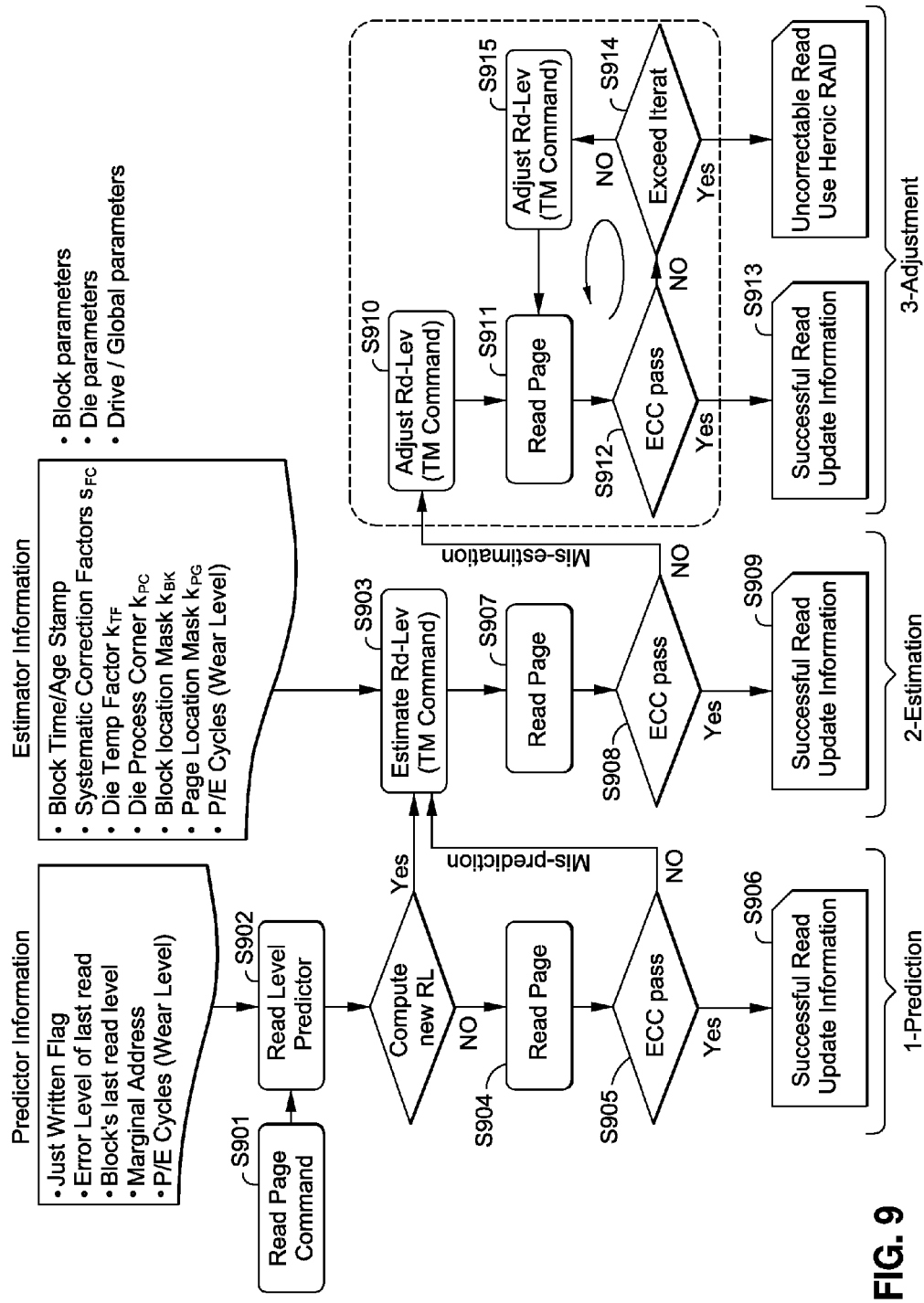
FIG. 9 is a flowchart illustrating an overall process for predicting, estimating and adjusting a read level according to one aspect of the subject technology.

FIG. 9 is a flowchart illustrating an overall process for predicting, estimating and adjusting a read level according to one aspect of the subject technology. In step S901, controller 101 receives a read command from host 104 (for example, via interface 105). Then, in step S902, controller 101 attempts to predict whether a new read level voltage should be estimated. In some aspects, the prediction is determined according to the above procedure described with reference to FIG. 4 and/or FIG. 5. If a new read level voltage should be estimated then controller will proceed to step S903 to estimate a new value in accordance with the above procedure described with reference to FIG. 6. Otherwise, if controller 101 determines that no estimation is necessary, in step S904, controller 101 executes commands to read memory 103 in accordance with the read command. After a read operation is completed, in step S905, controller 101 verifies the quality of the read using Error Correction Coding (ECC). Those skilled in the art will recognize how to verify the quality using various ECC schemes. If the BER is below a predetermined acceptable limit (for example, determined by a number of errors correctable by ECC), in step S906, controller 101 completes the read operation by returning the data to host 104 via interface 105 and stores and/or updates prediction information (for example, Read Level, BER, BRLEV, Just Written Flag, Error Level, Block Time Stamp, $S_{CF}$, and the like) to storage medium 102. Turning back to step S903, after estimation, in step S907, controller 101 will complete the read operation and proceed to step S908 to verify the quality of the read data using ECC. Providing the results of ECC are acceptable, in step S909, controller 101 will return the data, and store prediction information and/or estimation (for example, store/update read level). If the result of ECC is not acceptable after estimation, controller 101 will attempt to undertake a read level adjustment and re-read the page and/or block of memory 103.

Read Level Adjustment

With continued reference to FIG. 9, in some aspects, if controller, determines a re-read of memory 103 is required, controller 101 adjusts the read level conditions and performs one or more re-read operations. The criteria for the read level used by each re-read operation can be either a "blind" read using a predefined number of read level steps or an "adaptive" operation whereby a new read level is computed from the parameters and/or results of the previous read operation or operations/attempts (for example, a quality metric). In step S910, following a read failure, the read level is adjusted by determining a revised read level (RRL) voltage as a function of the read level voltage and a correction element. In some aspects, the correction element is the previously described Systematic Correction Element $S_{CF}$, or an updated value of the same. In step S911, controller 101 will complete a re-read operation and proceed to step S912 to verify the quality of the read using ECC. Providing that the results of ECC are acceptable, in step S913, controller 101 will return the data and store prediction and/or estimation information (for example, store/update the read level). If the result of ECC is not acceptable after a re-read, controller 101 will increment a number of re-read iterations and, in step S914, determine if a maximum number of iterations (for example, stored in storage medium 102) has been exceeded. If the maximum number of iterations has not been exceeded, in step S915, controller 101 will attempt to undertake a subsequent read level adjustment and re-read the page and/or block of memory 103 in accordance with step S911. In some aspects, the adjustment may include determining a voltage threshold displacement factor as a function of the number of re-read iterations, and then determining $S_{CF}$ as a function of the voltage threshold displacement factor. If the number of re-read iterations is exceeded then controller 101 returns an error reporting the read was uncorrectable. In some aspects, storage system 100 and/or host 104 can undertake a mitigation strategy such as accessing a RAID.

Figure 10:
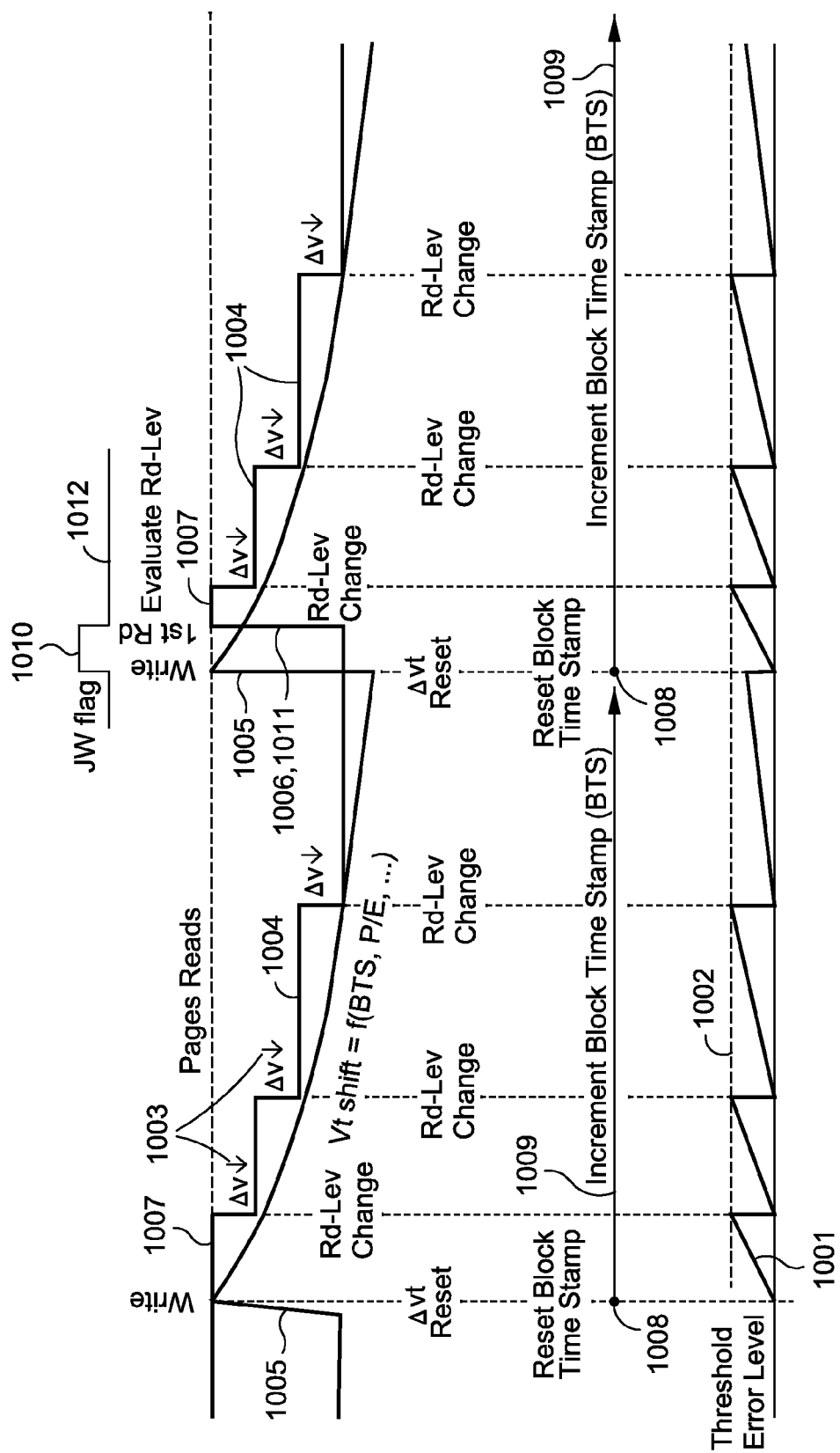
FIG. 10 is a graph diagram of a voltage threshold adjustment over time and read and write operations according to one aspect of the subject technology.

FIG. 10 is a graph diagram of a voltage threshold adjustment over time and read and write operations according to one aspect of the subject technology. In one aspect, when the error level 1001 exceeds a given threshold 1002, controller 101 will undertake to execute a new read level computation at the next read operation (see FIG. 6). According to the previously described procedure, controller 101 will estimate a shift 1003 in read level voltage 1004. In one aspect, read level voltage 1004 will shift left (reduce) with increasing dwell time. In other aspects, read level voltage 1004 will shift right (increase) as P/E cycles increase (see FIG. 3). In one aspect, on each write operation 1005, controller 101 resets 1006 the estimated shift 1003 in read level voltage 1004 (FIG. 6) to its initial (or nominal) value 1007, and performs a Block Time Stamp (BTS) Reset 1008 to reset the Block Time Stamp associated (for example, stored on storage medium 102) with the block on which the write was executed. Accordingly, the first read operation will compute a new read level. On each subsequent read operation, controller increments 1009 the BTS to keep track of the dwell time for the block. In one aspect, controller 101 sets a Just Written Flag 1010 on a write operation to notify the first subsequent read operation that a new read level voltage should be determined (see, for example, FIG. 5, step S502). On a first subsequent read 1011, controller 101 clears 1012 Just Written Flag 1010.

Choosing memory read levels statically at the beginning of life (BOL) in 2-bit/cell MLC NAND flash devices, results in wide SSD performance variation and limits the number of P/E cycles a memory device can undergo, given the maximum acceptable BER level and the expected retention time. Furthermore, attempting to re-read a memory cell is time consuming and may cause further deterioration in memory cell performance. Contrary to industry practice, in the subject technology, read levels are not fixed apriori. In some aspects, they are predicted and/or dynamically adjusted to conform to deteriorating, and thus moving, voltage threshold distributions as the memory device degrades during cycling and retention. They may further be adjusted to reduce BER. In some aspects, the prediction and/or adjustment occurs during run-time, for example, when the drive is in operation. By dynamically predicting, estimating, and adjusting read levels, for the same level of maximum acceptable BER and the same expected retention time, the subject technology allows a drive to achieve a higher number of cycles than a drive without the subject technology. Similarly, for the same number of cycles and the same expected retention time the subject technology allows the SSD to achieve a lower BER, markedly improving SSD performance throughout the lifetime of the drive.

It should be understood that in all cases data may not always be the result of a command received from host 104 and/or returned to host 104. In some aspects, Controller 101 may be configured to execute a read operation independent of host 104 (for example, to verify read levels or BER). The predicate words "configured to", "operable to", and "programmed to" as used herein do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (for example, arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. The previous description provides various examples of the subject technology, and the subject technology is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (for example, his) include the feminine and neuter gender (for example, her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples. A phrase such as an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A method for determining a read level voltage to apply to a memory cell in a flash memory circuit, comprising:
   receiving an instruction for performing a current read operation on one or more memory cells in the memory circuit;
   after receiving the instruction and prior to the current read operation being performed, comparing a prediction value to a prediction indicator to determine whether the read level voltage should be estimated;
   calculating the read level voltage as a function of a first read level voltage used in a prior read operation and an estimation parameter when the read level voltage should be estimated; and
   providing to the memory circuit, in connection with the current read operation, a programming command representative of the calculated read level voltage to read the one or more memory cells.

2. The method of claim 1, wherein the prediction indicator is generated at run-time from a look-up table.

3. The method of claim 1, further comprising:
   setting the prediction value equal to a binary true in conjunction with providing a write command to the memory circuit,
   wherein comparing the prediction value to the prediction indicator includes determining whether the prediction value is equal to the binary true, the programming command being provided to the memory circuit when the prediction value is equal to the binary true.

4. The method of claim 3, further comprising:
   setting the prediction value equal to a binary false in conjunction with providing a read command to the memory circuit.

5. The method of claim 1, wherein the prediction value is a read address and the prediction indicator is a critical address, the programming command being provided to the memory circuit when the read address is equal to the critical address.

6. The method of claim 1, further comprising:
   calculating an error level value as a function of a quality of a previous read operation; and
   calculating a read level margin (RLM) value as a function of the error level value and a number of program/erase (P/E) cycles, wherein the prediction value includes the RLM value and the prediction indicator is a RLM threshold value, the programming command being provided to the memory circuit when the RLM value reaches the RLM threshold value.

7. The method of claim 6, wherein the number of P/E cycles is a range of P/E cycles, a current P/E cycle being in the range of P/E cycles.

8. The method of claim 1, further comprising:
calculating the estimation parameter as a function of a memory dwell time associated with the one or more memory cells and a number of P/E cycles associated with the one or more memory cells.

9. The method of claim 8, wherein the memory dwell time is associated with a memory block, the memory block including the one or more memory cells.

10. The method of claim 8, further comprising:
calculating a temperature factor as a function of a die temperature associated with the memory circuit and a drive temperature, wherein the estimation parameter is also calculated as a function of the temperature factor.

11. The method of claim 8, further comprising:
calculating a process corner factor as a function of a nominal process corner associated with the memory circuit and the number of P/E cycles, wherein the estimation parameter is also calculated as a function of the process corner factor.

12. The method of claim 8, further comprising:
calculating a location correction factor as a function of a block location associated with the memory circuit and a page location associated with the memory circuit, wherein the estimation parameter is also calculated as a function of the location correction factor.

13. The method of claim 8, further comprising:
verifying a read operation performed on the one or more memory cells has failed; and
following the failure of the read operation, calculating a revised read level (RRL) voltage as a function of the read level voltage and a correction element, providing to the memory circuit a programming command representative of the RRL voltage to re-read the one or more memory cells; and incrementing a number of re-read iterations.

14. The method of claim 13, further comprising:
following the failure of the read operation, calculating a voltage threshold displacement factor as a function of the number of re-read iterations, and calculating the correction element as a function of the voltage threshold displacement factor.

15. The method of claim 13, further comprising:
following the failure of the read operation, repeating the calculating, providing, and incrementing steps until an acceptable bit error rate is achieved or a maximum number of re-read iterations is reached.

16. A machine-readable medium including machine-executable instructions for determining a read level voltage to apply to a memory block of a flash memory circuit, the instructions, when executed by a machine or computing device, cause the machine or computing device to perform a method comprising the steps of:
receiving an instruction for performing a current read operation on one or more memory cells in the memory circuit;
after receiving the instruction and prior to the current read operation being performed, comparing a prediction value to a prediction indicator to determine whether the read level voltage should be estimated;
calculating the read level voltage as a function of a first read level voltage used in a prior read operation and an estimation parameter when the read level voltage should be estimated; and
providing to the memory circuit, in connection with the current read operation, a programming command representative of the calculated read level voltage to read the one or more memory cells.

17. A method for determining a read level voltage to apply to a memory cell in a flash memory circuit, comprising:
determining the new read level voltage should be estimated when a read address is equal to a marginal address or a read level margin (RLM) value reaches a RLM threshold value, the RLM value being calculated when the read operation is the first read after the write operation and the read address is equal to the marginal address, the RLM value being calculated as a function of an error level value and a number of program/erase (P/E) cycles;
on determining the new read level voltage should be estimated, determining the new read level voltage, otherwise setting the new read level voltage to a present read level voltage; and
reading a group of memory cells using the new read level voltage.

18. A machine-readable medium including machine-executable instructions for predicting a new flash memory read level voltage should be estimated, the instructions, when executed by a machine or computing device, cause the machine or computing device to perform a method comprising the steps of:
determining the new read level voltage should be estimated when a read address is equal to a marginal address or a read level margin (RLM) value reaches a RLM threshold value, the RLM value being calculated when the read operation is the first read after the write operation and the read address is equal to the marginal address, the RLM value being calculated as a function of an error level value and a number of program/erase (P/E) cycles;
on determining the new read level voltage should be estimated, determining the new read level voltage, otherwise setting the new read level voltage to a present read level voltage; and
reading a group of memory cells using the new read level voltage.

19. A control circuit for determining a read level voltage to apply to a memory cell in a non-volatile memory circuit, comprising:
a memory interface configured to be operably coupled to the memory circuit; and
a controller, wherein the controller is configured to:
on receiving a signal from a host interface representative of a memory read operation associated with the memory circuit and prior to the read operation being performed,
compare a prediction value to a prediction indicator to determine whether the read level voltage should be estimated,
calculate the read level voltage as a function of a first read level voltage used in a prior read operation and an estimation parameter when the read level voltage should be estimated, and
provide to the memory interface, in connection with the read operation, a programming command representative of the calculated read level voltage to read one or more memory cells.

20. The control circuit of claim 19, wherein the controller is further configured to:
generate the prediction indicator at run-time from a look-up table.

21. The control circuit of claim 19, wherein the controller is further configured to:
set the prediction value equal to a binary true in conjunction with providing a write command to the memory circuit,
wherein the controller being configured to compare the prediction value to the prediction indicator includes the controller being configured to determine whether the prediction value is equal to the binary true, the controller being configured to provide the programming command to the memory interface when the memory circuit is operably connected to the memory interface and the prediction value is equal to the binary true.

22. The control circuit of claim 21, wherein the controller is further configured to:
set the prediction value equal to a binary false in conjunction with providing a read command to the memory circuit.

23. The method of claim 19, wherein the prediction value is a read address and the prediction indicator is a critical address, the controller being configured to provide the programming command to the memory interface when the memory circuit is operably connected to the memory interface and the read address is equal to the critical address.

24. The control circuit of claim 19, wherein the controller is further configured to:
calculate an error level value as a function of a quality of a previous read operation; and
calculate a read level margin (RLM) value as a function of the error level value and a number of program/erase (P/E) cycles,
wherein the prediction value includes the RLM value and the prediction indicator is a RLM threshold value, the controller providing the programming command to the memory interface When the memory circuit is operably connected to the memory interface and the RLM value reaches the RLM threshold value.

25. The method of claim 24, wherein the number of P/E cycles is a range of P/E cycles, a current P/E cycle being in the range of P/E cycles.

26. The control circuit of claim 19, wherein the controller is further configured to:
calculate the estimation parameter as a function of a memory dwell time associated with the one or more memory cells and a number of P/E cycles associated with the one or more memory cells.

27. The method of claim 26, wherein the memory dwell time is associated with a memory block, the memory block including the one or more memory cells.

28. The control circuit of claim 26, wherein the controller is further configured to:
calculate a temperature factor as a function of a die temperature associated with the memory circuit and a drive temperature, wherein the controller is also configured to calculate the estimation parameter as a function of the temperature factor.

29. The control circuit of claim 26, wherein the controller is further configured to:
calculate a process corner factor as a function of a nominal process corner associated with the memory circuit and the number of P/E cycles, wherein the controller is also configured to calculate the estimation parameter as a function of the process corner factor.

30. The control circuit of claim 26, wherein the controller is further configured to:
calculate a location correction factor as a function of a block location associated with the memory circuit and a page location associated with the memory circuit, wherein the controller is also configured to calculate the estimation parameter as a function of the location correction factor.

31. The control circuit of claim 26, wherein the controller is further configured to:
verify a read operation performed on the one or more memory cells has failed, and
following the failure of the read operation,
calculate a revised read level (RRL) voltage as a function of the read level voltage and a correction element, and
provide to the memory interface a programming command representative of the RRL voltage to re-read the one or more memory cells; and
increment a number of re-read iterations.

32. The control circuit of claim 31, wherein the controller is further configured to:
following the failure of the read operation, calculate a voltage threshold displacement factor as a function of the number of re-read iterations, and calculate the correction element as a function of the voltage threshold displacement factor.

33. The control circuit of claim 31, wherein the controller is further configured to:
following the failure of the read operation, repeat the calculate, provide, and increment steps until an acceptable bit error rate is achieved or a maximum number of re-read iterations is reached.

34. A system for determining a read level voltage to apply to a memory cell in a non-volatile memory circuit, comprising:
a host interface configured to be operably coupled to a host device, to receive data from the host device, and to send data to the host device;
a storage medium interface operably coupled to a volatile memory;
a memory interface operably coupled to the memory circuit; and
a controller operably coupled to the host interface, wherein the controller is, on receiving a signal from a host interface representative of a memory read operation associated with the memory circuit, operable to:
before the read operation is performed, compare a prediction value to a prediction indicator to determine whether the read level voltage should be estimated,
calculate the read level voltage as a function of a first read level voltage used in a prior read operation and an estimation parameter when the read level voltage should be estimated, and
provide to the memory circuit a programming command representative of the calculated read level voltage to read one or more memory cells.

35. The system of claim 34, wherein the controller is further operable to:
index a lookup table stored on the volatile memory by a number of P/E cycles associated with the one or more memory cells to retrieve a estimation value; and
calculate the estimation parameter as a function of a memory dwell time associated with the one or more memory cells and the estimation value.

* * * * *